United States Patent
Shimizu

(10) Patent No.: US 10,180,532 B2
(45) Date of Patent: Jan. 15, 2019

(54) ILLUMINATION DEVICE AND DISPLAY DEVICE

(71) Applicant: Sharp Kabushiki Kaisha, Sakai, Osaka (JP)

(72) Inventor: Takaharu Shimizu, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 15/554,469

(22) PCT Filed: Mar. 11, 2016

(86) PCT No.: PCT/JP2016/057858
§ 371 (c)(1),
(2) Date: Aug. 30, 2017

(87) PCT Pub. No.: WO2016/148087
PCT Pub. Date: Sep. 22, 2016

(65) Prior Publication Data
US 2018/0045877 A1    Feb. 15, 2018

(30) Foreign Application Priority Data

Mar. 18, 2015 (JP) ................................ 2015-054856
Mar. 18, 2015 (JP) ................................ 2015-054857

(51) Int. Cl.
*F21V 8/00* (2006.01)
*G02F 1/1335* (2006.01)
(Continued)

(52) U.S. Cl.
CPC .............. *G02B 6/0055* (2013.01); *F21S 2/00* (2013.01); *F21V 23/00* (2013.01); *F21V 23/06* (2013.01);
(Continued)

(58) Field of Classification Search
CPC . G02B 6/0055; F21V 23/06; G02F 1/133603; G02F 1/133608;
(Continued)

(56) References Cited

U.S. PATENT DOCUMENTS

2010/0097541 A1* 4/2010 Tomiyoshi ........ G02F 1/133603
349/61
2012/0044668 A1 2/2012 Takeuchi
(Continued)

FOREIGN PATENT DOCUMENTS

JP  2010-062456 A  3/2010
JP  4599470 B2  12/2010
(Continued)

OTHER PUBLICATIONS

Official Communication issued in International Patent Application No. PCT/JP2016/057858, dated Jun. 7, 2016.

*Primary Examiner* — Laura Gudorf
(74) *Attorney, Agent, or Firm* — Keating & Bennett, LLP

(57) ABSTRACT

An illumination device according to an aspect of the present disclosure is provided with a dish-shaped accommodating body, a plurality of light source substrates on each of which a light source is mounted on one face, and which are aligned on an inner face of a base wall of the accommodating body, a reflecting sheet which covers the one face, and the inner face of the accommodating body, and reflects light, and a power supply unit, the illumination device including a connector which is provided on the one face; a power feeding member which is formed of a flexible printed board, disposed between the base wall and the reflecting sheet, and feeds power from the power supply unit to the light source substrate; and a light source connecting portion which is provided in the power feeding member, and is electrically connected to the connector.

15 Claims, 12 Drawing Sheets

(51) Int. Cl.
*H05K 1/14* (2006.01)
*F21V 23/00* (2015.01)
*F21V 23/06* (2006.01)
*F21S 2/00* (2016.01)
*G02F 1/1333* (2006.01)

(52) U.S. Cl.
CPC ...... *G02F 1/1333* (2013.01); *G02F 1/133603* (2013.01); *G02F 1/133608* (2013.01); *H05K 1/142* (2013.01); *G02F 2001/133612* (2013.01); *H05K 2201/10106* (2013.01)

(58) Field of Classification Search
CPC ........ G02F 2001/133612; H05K 1/142; H05K 2201/10106
See application file for complete search history.

(56) References Cited

U.S. PATENT DOCUMENTS

| | | | | |
|---|---|---|---|---|
| 2012/0092562 | A1* | 4/2012 | Omiya | H04N 5/64 348/725 |
| 2013/0229596 | A1* | 9/2013 | Hosoki | F21V 21/00 349/65 |
| 2014/0307420 | A1 | 10/2014 | Ishizuka | |

FOREIGN PATENT DOCUMENTS

| | | |
|---|---|---|
| JP | 2012-013722 A | 1/2012 |
| JP | 2013-164943 A | 8/2013 |
| JP | 2013-229232 A | 11/2013 |
| JP | 2014-206641 A | 10/2014 |

* cited by examiner

FIG. 4
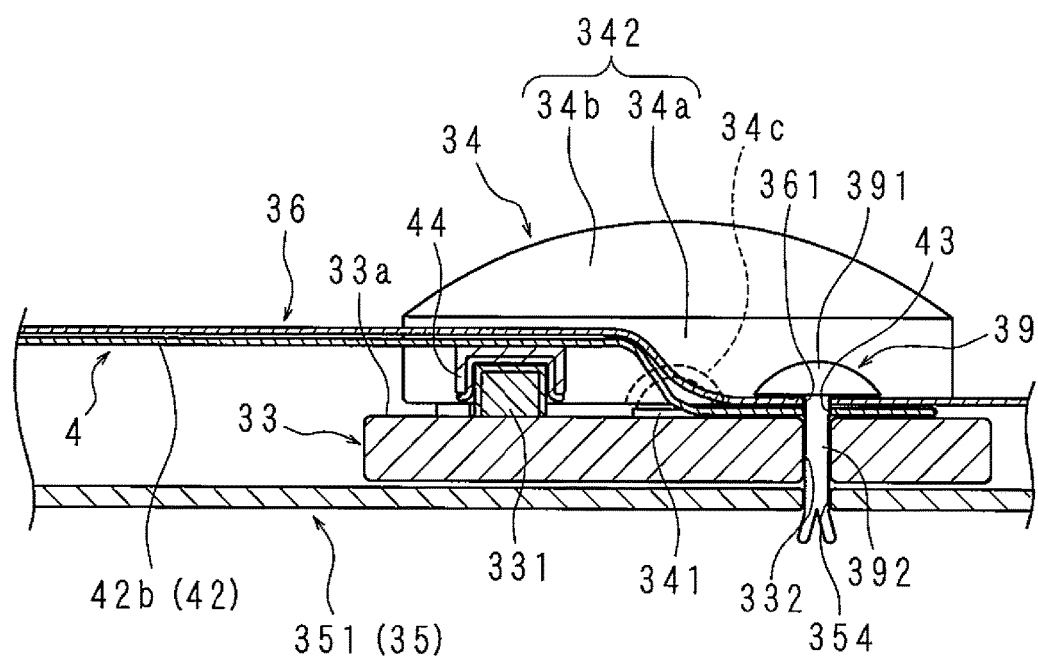
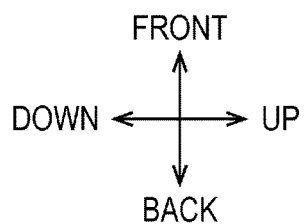

FIG. 11
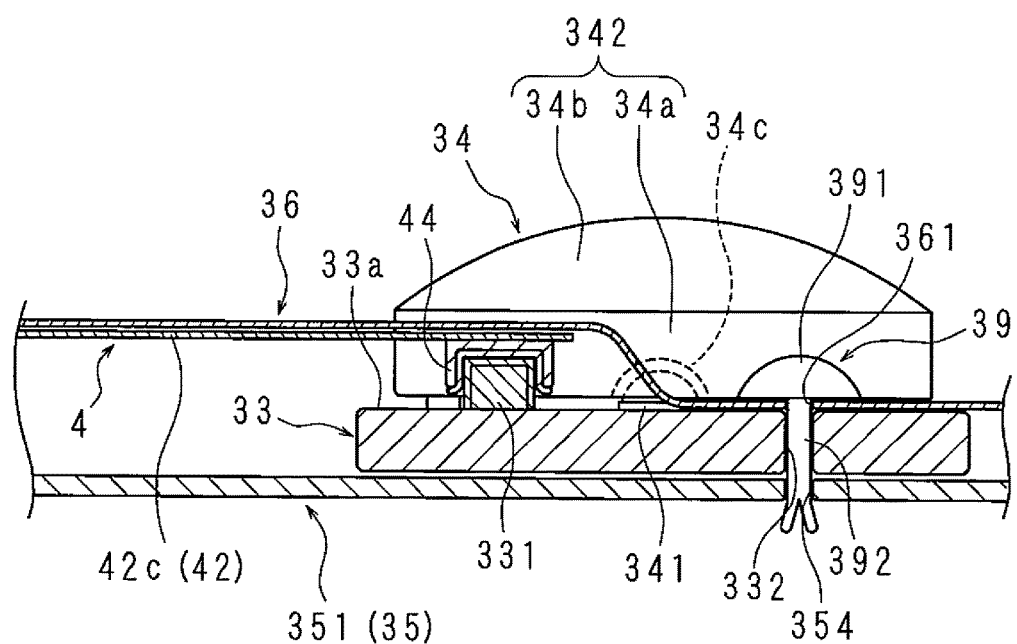
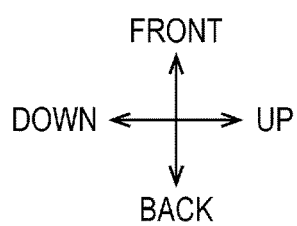

ILLUMINATION DEVICE AND DISPLAY DEVICE

CROSS REFERENCE TO RELATED APPLICATIONS

This application is the national phase under 35 U.S.C. § 371 of PCT International Application No. PCT/JP2016/057858 which has an International filing date of Mar. 11, 2016 and designated the United States of America.

FIELD

The present invention relates to an illumination device in which a plurality of light source substrates are aligned, and a display device.

BACKGROUND

A liquid crystal display device is provided with a liquid crystal display panel, and an illumination device including a plurality of light emitting diodes (LED). The illumination device illuminates the liquid crystal display panel from the rear face side.

In a case of an edge light-type illumination device, a plurality of LEDs are aligned facing an end face of a light guide plate which is disposed so as to face the liquid crystal display panel (refer to Japanese Unexamined Patent Application Publication No. 2012-13722).

In a case of a direct-type illumination device, a plurality of LEDs are aligned facing the rear face of the liquid crystal display panel (refer to Japanese Unexamined Patent Application Publication No. 2013-164943, Japanese Unexamined Patent Application Publication No. 2013-229232, and Japanese Patent No. 4599470).

In a case of performing local dimming, it is advantageous to adopt the direct type rather than the edge light type. Hereinafter, the direct-type illumination device will be described.

The LED is mounted on an LED substrate, and is accommodated in a dish-shaped chassis. The LED substrate is fixed to a base wall of the chassis. A power supply circuit for feeding power to the LED is disposed on the outer side of the chassis.

SUMMARY

Here, a case in which one rectangular LED substrate of which an aspect ratio is large, and with a large area is disposed, and a case in which a plurality of strip-shaped LED substrates of which an aspect ratio is small, and with a small area are aligned in an illumination device corresponding to local dimming will be compared to each other.

In a case in which only one rectangular LED substrate is disposed, there is a useless portion on the LED substrate which may not be used in mounting of LED, wiring, or the like.

Meanwhile, in a case of a plurality of strip-shaped LED substrates are aligned, it is possible to exclude the useless portion which may not be used in mounting of LED, wiring, or the like. Accordingly, it is advantageous to align a plurality of strip-shaped LED substrates, compared to a case of disposing only one rectangular LED substrate.

However, in a case of the rectangular LED substrate, since the power supply circuit and one LED substrate may be connected using a couple of feeder lines, wiring becomes easy.

On the other hand, in a case of the strip-shaped LED substrate, since the power supply circuit and the plurality of respective LED substrates should be connected using a plurality of feeder lines, wiring becomes difficult.

It is an object to provide an illumination device and a display device in which wiring can be easily performed.

An illumination device according to an aspect of the present disclosure is provided with a dish-shaped accommodating body, a plurality of light source substrates on each of which a light source is mounted on one face, and which are aligned on an inner face of a base wall of the accommodating body, a reflecting sheet which covers the one face, and the inner face of the accommodating body, and reflects light, and a power supply unit, the illumination device including a connector which is provided on the one face; a power feeding member which is formed of a flexible printed board, disposed between the base wall and the reflecting sheet, and feeds power from the power supply unit to the light source substrate; and a light source connecting portion which is provided in the power feeding member, and is electrically connected to the connector.

In the illumination device according to another aspect of the present disclosure, the power feeding member may be formed in a belt shape, may be electrically connected to the power supply unit, and the light source substrates may be formed in a strip shape, and may be aligned in a width direction of the light source substrate along a lengthwise direction of the power feeding member.

In the illumination device according to another aspect of the present disclosure, the power feeding member may be formed in a belt shape, may be electrically connected to the power supply unit, end portions of two of the light source substrates may be adjacent to each other in a width direction of the power feeding member, and the connector may be disposed at the end portion.

In the illumination device according to another aspect of the present disclosure, the light source may include a light emitting unit which is mounted on the one face, and a lens which covers the light emitting unit, and includes a light input portion to which light emitted from the light emitting unit is input, and a light output portion from which light input to the light input portion is output, and a height of the reflecting sheet from the one face at a portion which covers the one face may be set to be lower than a height of the light output portion from the one face.

In the illumination device according to another aspect of the present disclosure, a through-hole may be provided on the base wall, and the power supply unit may be disposed on an outer face of the base wall, and may be electrically connected to the power feeding member through the through-hole.

In the illumination device according to another aspect of the present disclosure, the light source connecting portion, and a power supply connecting portion for being electrically connected to the power supply unit may be provided on one face of the power feeding member.

In the illumination device according to another aspect of the present disclosure, a portion of the power feeding member in which the light source connecting portion is provided may cover the connector, the power feeding member may include a tongue piece, and the tongue piece may be closely fixed to the base wall.

In the illumination device according to another aspect of the present disclosure, the power feeding member may include a belt-shaped main body portion, and a plurality of arm pieces which are provided in a protruding manner in the main body portion, and the light source connecting portion may be provided in the arm piece.

In the illumination device according to another aspect of the present disclosure, each of the light source substrates and the power supply unit may be electrically connected, individually, through the power feeding member.

An illumination device according to an aspect of the present disclosure is provided with a dish-shaped accommodating body, a plurality of light source substrates on each of which a light source is mounted on one face, and which are aligned on an inner face of a base wall of the accommodating body, a reflecting sheet which covers the one face, and an inner face of the accommodating body, and reflects light, and a power supply unit, in which the light source substrate is formed in a strip shape, the illumination device including a connector which is provided on the one face of the light source substrate of a non-end portion in a lengthwise direction; a power feeding member which is formed of a flexible printed board, or a flat cable, disposed between the base wall and the reflecting sheet, and feeds power from the power supply unit to the light source substrate; and a light source connecting portion which is provided in the power feeding member, and is electrically connected to the connector.

In the illumination device according to another aspect of the present disclosure, the connector may be disposed in two central regions among four regions obtained by virtually and equally dividing the light source substrate in a lengthwise direction.

In the illumination device according to another aspect of the present disclosure, the connector may be disposed at an end portion of the light source substrate in a width direction.

In the illumination device according to another aspect of the present disclosure, at least one of the light source substrate may be disposed at a peripheral edge portion of the base wall, and the power feeding member may be disposed on a center portion side of the base wall compared to the light source substrate which is disposed at the peripheral edge portion of the base wall.

In the illumination device according to another aspect of the present disclosure, the light source substrate or the power feeding member may be jointly fastened to the base wall together with the reflecting sheet.

A display device according to an aspect of the present disclosure includes the illumination device in the aspect of the present disclosure, and a display panel which is illuminated from a rear face side using the illumination device.

A television receiver includes the display device according to the aspect of the present disclosure, and a reception unit which receives television broadcasting, and displays pictures on the display device based on the television broadcasting received in the reception unit.

According to the illumination device and the image display device in an aspect of the present disclosure, it is possible to easily perform wiring between a power supply unit and a light source substrate using a flexible printed board.

The above and further objects and features will more fully be apparent from the following detailed description with accompanying drawings.

BRIEF DESCRIPTION OF THE DRAWINGS

FIG. 4 is a sectional view which schematically illustrates a configuration of the illumination device in the vicinity of a light source substrate.

FIG. 11 is a sectional view which schematically illustrates a configuration of the illumination device in the vicinity of a light source substrate.

DETAILED DESCRIPTION

Hereinafter, the disclosure will be described in detail based on drawings which illustrate embodiments thereof. In descriptions below, up and down, front and back, and left and right denoted by arrows will be used.

Embodiment 1

Figure 1:
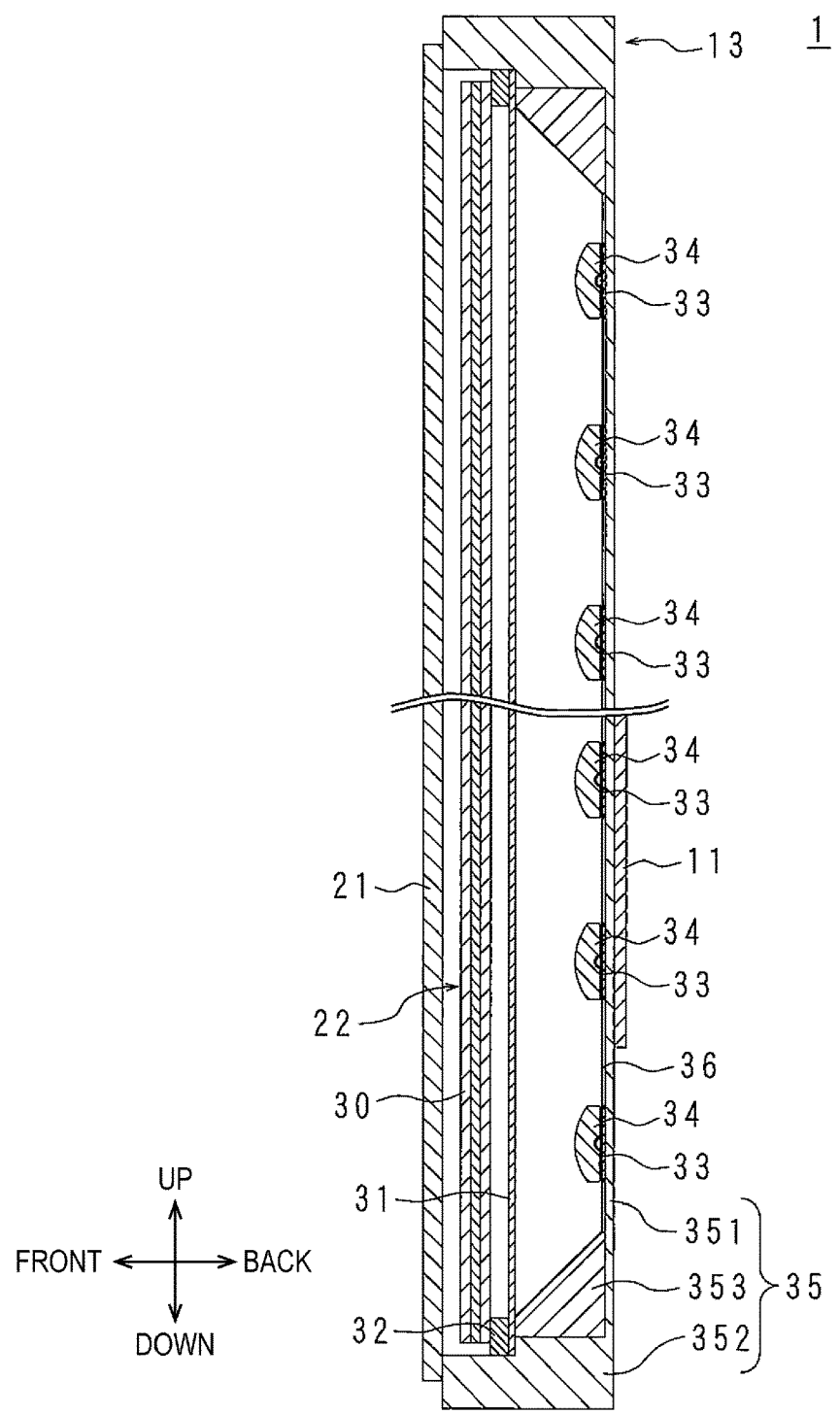
FIG. 1 is a sectional view which schematically illustrates a configuration of a television receiver which is provided with a display device according to Embodiment 1 of the disclosure.

FIG. 1 is a sectional view which schematically illustrates a configuration of a television receiver 1 provided with a display device 13 according to a first embodiment of the disclosure.

Figure 2:
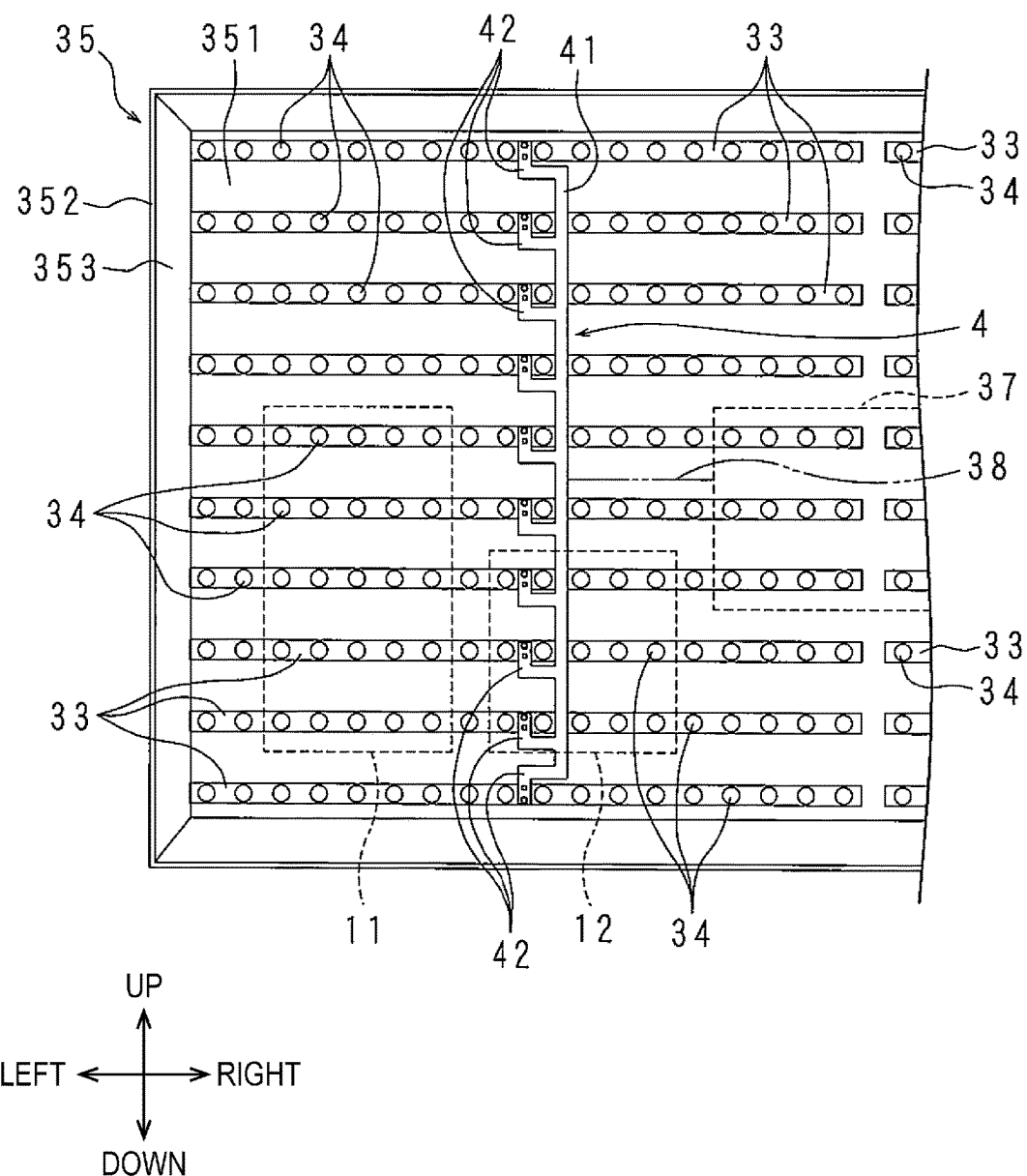
FIG. 2 is a front view which schematically illustrates a configuration of an illumination device provided in the display device.
Figure 3:
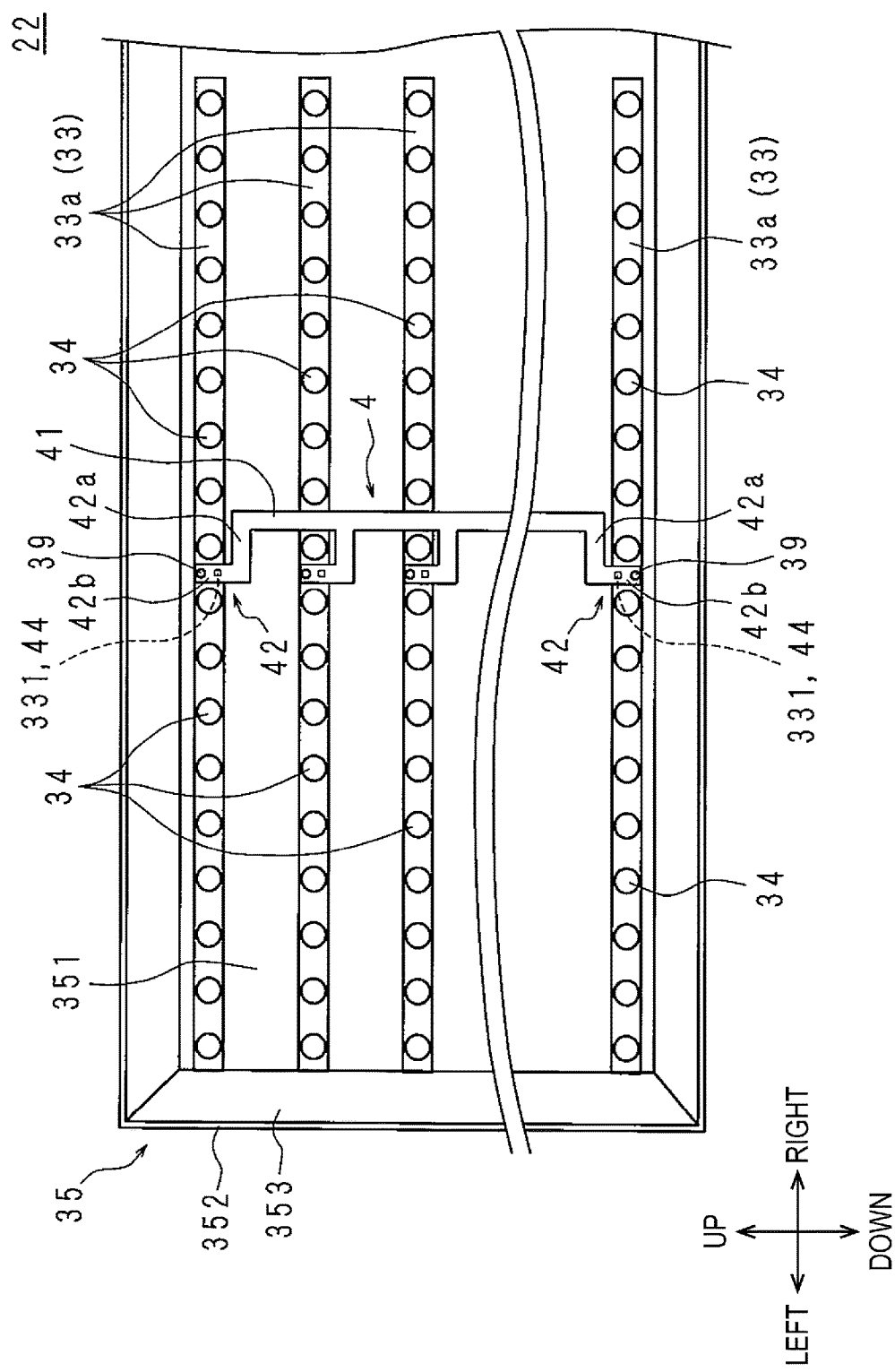
FIG. 3 is an enlarged front view which schematically illustrates a configuration of the illumination device.

FIGS. 2 and 3 are a front view and an enlarged front view which schematically illustrate a configuration of an illumination device 22 provided in the display device 13.

FIG. 4 is a sectional view which schematically illustrates a configuration of the illumination device 22 in the vicinity of a light source substrate 33.

The television receiver 1 is a stationary type, a wall hanging type, or the like. The television receiver 1 is provided with a reception unit 11, a signal processing unit 12, and the display device 13.

The reception unit 11 is a circuit board on which a reception circuit (not illustrated) is mounted. The reception circuit receives television broadcasting from the outside through an antenna (not illustrated), and outputs a broadcasting signal based on the received television broadcasting.

The signal processing unit 12 is a circuit board on which a signal processing circuit (not illustrated) is mounted. The signal processing circuit outputs picture data by performing prescribed signal processing with respect to a broadcasting signal output from the reception unit 11.

The display device 13 has a rectangular shape in a front view. The display device 13 is provided with a display panel 21, an illumination device 22, and a cabinet (not illustrated) which accommodates thereof. The reception unit 11 and the signal processing unit 12 are also accommodated in the cabinet. The reception unit 11 and the signal processing unit 12 may be attached to the display device 13 from the outside.

A rectangular plate-shaped liquid crystal display panel is used in the display panel 21. The display panel 21 includes a rectangular display region, and a rectangular frame-shaped frame region which encloses the display region. The display region (and frame region) is located at a center portion (and peripheral edge portion) of the display panel 21. Pictures based on picture data output from the signal processing unit 12 are displayed in the display region of the display panel 21.

The illumination device 22 is provided with an optical sheet group 30, a diffusion plate 31, a spacer 32, a plurality of light source substrates 33, 33, . . . , a plurality of light sources 34, 34, . . . , an accommodating body 35, a reflecting sheet 36, a power supply unit 37, two wiring members 38 and 38, a plurality of joint fastening members 39, 39, . . . , and two power feeding members 4 and 4.

A plurality of optical sheets including optical transparency, respectively, are stacked in the optical sheet group 30. Each optical sheet includes a light diffusing function, a condensing function, a polarizing function, or the like. The optical sheet group 30 is formed in a rectangular shape of which an area is larger than a display region of the display panel 21. The optical sheet group 30 is disposed so as to face a rear face of the display region of the display panel 21 with an appropriate distance.

The diffusion plate 31 has a light diffusing property. Light transmittance of the diffusion plate 31 is approximately 50%. Part of light input to the rear face of the diffusion plate 31 penetrates the diffusion plate 31, and is output from the front face of the diffusion plate 31 by being diffused. Another part of light input to the rear face of the diffusion plate 31 is reflected on the rear face side. The diffusion plate 31 is formed in a rectangular shape of which an area is larger than that of the optical sheet group 30. The diffusion plate 31 is disposed so as to face the rear face of the optical sheet group 30 with an appropriate distance.

The spacer 32 is formed in a frame shape, and has shock-absorbing characteristics. The spacer 32 is interposed between the peripheral edge portion on the rear face of the optical sheet group 30 and the peripheral edge portion on the front face of the diffusion plate 31. A disposal position of the spacer 32 is a position which faces the frame region of the display panel 21.

In FIGS. 2 and 3, the optical sheet group 30, the diffusion plate 31, and the spacer 32 are not illustrated.

Each of the light source substrates 33 is formed in a strip shape. The plurality of light sources 34, 34, . . . are mounted on the front face 33a of the light source substrate 33. In FIGS. 1 and 3, a case in which eighteen light sources 34, 34, . . . are equally disposed is exemplified.

First, the light source 34 will be described.

Each of the light sources 34 includes a light emitting unit 341 and a lens 342.

An LED is used in the light emitting unit 341, and the LED is mounted on the front face 33a of the light source substrate 33.

The lens 342 includes a light input portion 34a and a light output portion 34b.

The light input portion 34a is formed in a columnar shape, and is attached to the light source substrate 33 by causing the rear face of the column to face the front face 33a of the light source substrate 33. An accommodating recessed portion 34c is provided at a lower face center portion of the light input portion 34a, and the light emitting unit 341 is accommodated in the accommodating recessed portion 34c. That is, the light emitting unit 341 is covered with the light input portion 34a of the lens 342. Therefore, light emitted from the light emitting unit 341 is input to the light input portion 34a.

The light output portion 34b is a protrusion portion provided on the front face of the column of the light input portion 34a, and has a spherical surface. Light input to the light input portion 34a penetrates the inside of the lens 342, and is output by being diffused from the surface of the light output portion 34b.

Subsequently, the light source substrate 33 will be described.

On the front face 33a of the light source substrate 33, a male connector 331 is provided on one long side portion (that is, end portion in width direction), and a through-hole 332 is provided on the other long side portion.

More specifically, respective disposal positions of the connector 331 and the through-hole 332 are a center portion of the light source substrate 33 in the lengthwise direction. The connector 331 and the through-hole 332 are disposed so as to face each other in the width direction of the light source substrate 33. Since the width of the light source substrate 33 is smaller than the length of the light source substrate 33, a separating distance between the connector 331 and the through-hole 332 is short. In other words, the through-hole 332 is disposed in the vicinity of the connector 331. The respective connector 331 and through-hole 332 are disposed at a center position between two light sources 34 and 34.

In addition, a disposal position of the connector 331 in the lengthwise direction of the light source substrate 33 is not limited to the center portion in the lengthwise direction, is a non-end portion in the lengthwise direction, preferably, and is a center portion in the lengthwise direction, more preferably. Specifically, the connector 331 may be disposed in two central regions among four regions obtained by virtually and equally dividing the light source substrate 33 in the lengthwise direction. However, it is most desirable to dispose the connector 331 at the center portion in the lengthwise direction, as in the embodiment.

The connector 331 is a so-called thin connector. A height of the connector 331 from the front face 33a is lower than that from the front face 33a at a boundary portion between the light input portion 34a and the light output portion 34b of the lens 342.

A plurality of the light source substrates 33 are aligned in the width direction and the lengthwise direction, respectively, with the respective width directions as the vertical direction, with the respective lengthwise directions as the horizontal direction, and with the front face 33a which faces the rear face of the diffusion plate 31. According to the embodiment, a case in which twenty light source substrates 33, 33, . . . are aligned in ten rows and two columns will be exemplified. In the two light source substrates 33 and 33 which are adjacent to each other in the horizontal direction, end portions (short side portions) in the lengthwise direction are disposed so as to face each other. In the two light source substrates 33 and 33 which are adjacent to each other in the vertical direction, end portions (long side portions) in the width direction are disposed so as to face each other.

A direction of the light source substrate 33 which is disposed at the lowest position is the same as a direction of a light source substrate 33 which is disposed at the highest position, and rotates by 180° in its own plane direction (reverse in vertical and horizontal directions). That is, in a case of the light source substrate 33 at the highest position, a long side portion at which the connector 331 is provided is a low side portion, and a long side portion at which the through-hole 332 is provided is a high side portion; however, in a case of the light source substrate 33 at the lowest position, a long side portion at which the connector 331 is provided is the high side portion, and a long side portion at which the through-hole 332 is provided is the low side portion. Respective directions of light source substrates 33 and 33 which are disposed at positions other than the highest position and the lowest position are the same as that of the light source substrate 33 at the highest position.

The accommodating body 35 is formed in a dish shape including a base wall 351, a peripheral wall 352, and a support portion 353. The accommodating body 35 accommodates the light source substrates 33, 33, . . . , the reflecting sheet 36, and the like.

The base wall 351 is formed in a rectangular shape with a smaller area than that of the diffusion plate 31. The support portion 353 is disposed at a boundary portion between the base wall 351 and the peripheral wall 352. The support portion 353 is formed in a rectangular frame shape of which a section is a right triangle, faces corresponding to two adjacent sides of the triangle are in contact with the base wall 351 and the peripheral wall 352, and a face corresponding to a hypotenuse faces the diffusion plate 31 side.

Hereinafter, the vicinity of the boundary portion between the base wall 351 and the support portion 353 in the base wall 351 is referred to as the peripheral edge portion (high side portion, low side portion, left side portion, and right side portion) of the base wall 351.

The light source substrates 33, 33, . . . are aligned on the inner face of the base wall 351 by having the respective rear faces which face the base wall 351. The light source substrates 33, 33, . . . are disposed also in the peripheral edge portion of the base wall 351. Specifically, the high side portion (or low side portion) of the light source substrate 33 which is disposed at the highest position (or lowest position) is closely disposed to the high side portion (or low side portion) of the base wall 351. In addition, the left side portion (or right side portion) of each of the light source substrate 33 which is disposed on the left side (or right side) is closely disposed to the left side portion (or right side portion) of the base wall 351.

A plurality of through-holes 354, 354, . . . are provided in the base wall 351.

The reception unit 11 and the signal processing unit 12 are attached to the rear face of the base wall 351.

A center portion of the peripheral wall 352 in the anteroposterior direction, and a front end portion of the support portion 353 support the peripheral edge portion of the diffusion plate 31.

An opening of the accommodating body 35 is closed by the display panel 21. For this reason, a front end portion of the peripheral wall 352 supports the peripheral edge portion of the display panel 21.

The reflecting sheet 36 has a light reflecting property. The reflecting sheet 36 covers the respective front faces 33a of the light source substrates 33, 33, . . . , and the inner face (specifically, inner face of base wall 351 and support portion 353) of the accommodating body 35. The connector 331 of each light source substrate 33 and the through-hole 332 are covered with the reflecting sheet 36; however, the light sources 34, 34, . . . are not covered. For this reason, openings are provided at portions of the reflecting sheet 36 corresponding to the respective light sources 34, 34, . . . . In addition, a portion of the accommodating body 35 which is located on the front side compared to the diffusion plate 31, in the inner face of the accommodating body is not covered with the reflecting sheet 36. In FIGS. 2 and 3, the reflecting sheet 36 is not illustrated.

A plurality of through-hole 361, 361, . . . are provided in the reflecting sheet 36.

The power supply unit 37 is attached to the outer side of the accommodating body 35 at a center portion in the vertical and horizontal directions on the rear face of the base wall 351.

The respective power feeding members 4 and 4 are provided so as to feed power to each of the light source substrates 33 from the power supply unit 37. One power feeding member 4 is used for feeding power to the light source substrates 33, 33, . . . (that is, light source substrates 33, 33, . . . in first column on left side) which are aligned on the left side in a vertical direction, and the other power feeding member 4 is used for feeding power to the light source substrates 33, 33, . . . (that is, light source substrates 33, 33, . . . in first column on right side) which are aligned on the right side in the vertical direction. The power feeding members 4 and 4 in the horizontal direction have the same configuration.

In the power feeding member 4, a flexible printed board of which a base film has optical transparency is used, and the power feeding member is disposed between the base wall 351 and the reflecting sheet 36. Since the power feeding member 4 is sufficiently thin, there is no concern that the base wall 351 and the reflecting sheet 36 are uselessly separated due to the power feeding member 4 which is interposed therebetween.

The power feeding member 4 contains a polyethylene terephthalate resin, or a polyethylene naphthalate resin. Therefore, the power feeding member 4 is cheaper than a general flexible printed board which contains a polyimide resin. In addition, when the polyethylene terephthalate resin, or the polyethylene naphthalate resin is used, it is possible to obtain a flexible printed board with optical transparency easily, and cheaply.

The power feeding member 4 includes a main body portion 41, and a plurality of arm pieces 42, 42, . . . .

The main body portion 41 is formed in a belt shape which is long in the vertical direction.

The number of arm pieces 42, 42, . . . is the same as that of the light source substrates 33, 33, . . . in the first column on the left side (or right side). Each of the arm pieces 42 includes a rectangular tongue-shaped tongue piece 42a on the base end side in which the lengthwise direction is the horizontal direction and a rectangular tongue-shaped tongue piece 42b on the tip end side in which the lengthwise direction is the vertical direction.

Each of the tongue pieces 42a on the base end side protrudes from the main body portion 41 in the width direction of the main body portion 41. The tongue pieces 42a, 42a, . . . on the base end side are aligned in the vertical direction. The tongue piece 42a on the base end side at the highest position (or the lowest position) is provided in a protruding manner at the highest end portion (or the lowest end portion) of the main body portion 41. A protruding direction of each of the tongue piece 42a on the base end side from the main body portion 41, and a protruding length thereof are the same.

Each of the tongue pieces 42b on the tip end side protrudes from a tip end portion of the tongue piece 42a on the base end side in the lengthwise direction of the main body portion 41. That is, a plurality of the tongue pieces 42b, 42b, . . . on the tip end side are aligned in line in the vertical direction. A length of each of the tip end side tongue pieces 42b which protrudes from the tongue piece 42a on the base end side is the same. The tip end side tongue piece 42b on the base end side at the highest position and the tongue piece 42b on the base end side at the lowest position protrude in the vertical direction of being separated from each other (the former goes to upward direction and the latter goes to downward direction). The tongue pieces 42b, 42b, . . . on the tip end side other than the tongue pieces 42b, 42b, . . . on the tip end side at the highest position and the lowest position protrude in the same direction as the protruding direction of the tongue pieces 42b on the tip end side at any one of the highest position and the lowest position (upward direction in embodiment). A through-hole 43 is provided at a tip end portion of the tip end side tongue pieces 42b.

Since the power feeding member 4 is flexible, it is possible to adjust a disposal of each of the tongue pieces 42a on the base end side around the boundary portion with the main body portion 41, and adjust a disposal of each of the tip end side tongue pieces 42b around the boundary portion with the tongue piece 42a on the base end side. Therefore, it is possible to align the tongue piece 42a on the base end side (or tip end side tongue pieces 42b) so as to be inclined to the main body portion 41 (or tongue piece 42a on the base end side), for example.

The tip end side tongue pieces 42b covers a portion at which the connector 331 and the through-hole 332 are provided, as a portion between two light sources 34 and 34 on the front face 33a of the light source substrate 33.

The main body portion 41 partially covers all of the light source substrates 33, 33, . . . except for the light source substrate 33 and 33 at the highest position and the lowest position. More specifically, the main body portion covers a portion other than the portion in which the connector 331 and the through-hole 332 are provided, as a portion between two light sources 34 and 34, on the front face 33a of each of the light source substrates 33.

A plurality of light source connecting portions 44, 44, . . . and a power supply connecting portion (not illustrated) are provided on one face of the power feeding member 4. In addition, a power feeding path (not illustrated) which individually connects the power supply connecting portion and each of the light source connecting portions 44 is formed in the power feeding member 4. The power feeding path may have optical transparency, or a light shielding property.

Since the light source connecting portions 44, 44, . . . and the power supply connecting portion are provided on the same face of the power feeding member 4, it is possible to reduce a manufacturing cost of the power feeding member 4 compared to a case in which these are individually provided on different faces of the power feeding member 4.

The light source connecting portions 44, 44, . . . are provided in the arm pieces 42, 42, . . . . More specifically, each of the light source connecting portions 44 is provided on the base end side of the tip end side tongue pieces 42b compared to the through-hole 43 in the tip end side tongue pieces 42b. A separating distance between the light source connecting portion 44 and the through-hole 43 corresponds to a separating distance between the connector 331 and the through-hole 332 in the light source substrate 33.

The light source connecting portion 44 is a female connector corresponding to the connector 331. The light source connecting portion 44 is electrically connected to the connector 331 when being fitted to the connector 331 from the front side.

Since the light source connecting portion 44 is provided in the arm piece 42, it is possible to easily adjust a disposal position of the light source connecting portion 44, compared to a case in which the light source connecting portion 44 is provided in the main body portion 41. Therefore, it is possible to easily connect the light source connecting portion 44 and the connector 331 even when the main body portion 41 and the light source substrates 33, 33, . . . are relatively shifted due to a dimensional error, a trouble at a time of disposal, or the like, or when a positional shift, or the like, due to an expansion or a contraction caused by a temperature change occurs, and it is possible to suppress a situation in which a connection is uselessly released.

A work of connecting the light source connecting portion 44 to the connector 331 by a manufacturer is a work which needs high workability. The reason for this is that, since the power feeding member 4 has optical transparency, it is possible to easily confirm a disposal position of the connector 331 through the power feeding member 4, even when the connector 331 is covered with the power feeding member 4.

The light source connecting portion of the power feeding member 4 is provided at a center portion of the main body portion 41 in the vertical direction. The power feeding member 4 is electrically connected to the power supply unit 37 through the power supply connecting portion and a wiring member 38. As a result, each of the light source substrates 33 and the power supply unit 37 are electrically connected, individually, through the power feeding member 4.

The wiring member 38 is formed, using a flexible printed board, a flat cable, or the like, and is pulled out to the inside or the outside of the accommodating body 35 by penetrating a through-hole (not illustrated) which is provided on the base wall 351.

The power supply connecting portion of the power feeding member 4 may protrude to the outside of the accommodating body 35 by penetrating a through-hole (not illustrated) which is provided on the base wall 351. In this case, it is not necessary to pull the wiring member 38 into the accommodating body 35.

A through-hole 361 of the reflecting sheet 36 and the through-hole 43 of the power feeding member 4, and the through-hole 332 of the light source substrate 33 and a through-hole 354 of the accommodating body 35 face each other in the anteroposterior direction. The respective through-holes 361, 43, 332, and 354 are formed in a circular shape in a front view, and have the same diameter as each other.

The reflecting sheet 36, the power feeding member 4, and the light source substrate 33 are jointly fastened to the base wall 351 using a joint fastening member 39.

The joint fastening member 39 includes a head portion 391 with a light reflecting property, and a leg portion 392 of which a tip end portion is bifurcated.

The bifurcated portions of the leg portion 392 have elasticity, and are separated from each other. The leg portion 392 penetrates the through-hole 361 of the reflecting sheet 36, the through-hole 43 of the power feeding member 4, the through-hole 332 of the light source substrate 33, and the through-hole 354 of the base wall 351 from the front side in this order.

The bifurcated portions of the leg portion 392 are caused to get closer to each other, forcibly, when being inserted into the through-holes 361, 43, 332, and 354; however, the bifurcated portions are separated from each other due to an elastic restoring force, when the tip end portion of the leg portion 392 protrudes toward the rear face side of the base wall 351. Since the bifurcated portions of the leg portion 392 are engaged with the peripheral edge portion of the through-hole 354, it is possible to suppress a situation in which the leg portion 392 is uselessly removed from the through-holes 361, 43, 332, and 354. In addition, at this time, the head portion 391 interposes the reflecting sheet 36, the power feeding member 4, and the light source substrate 33 between the head portion and the base wall 351.

As a result, the reflecting sheet 36, the power feeding member 4, and the light source substrate 33 are jointly fastened to the base wall 351.

The reflecting sheet 36, the power feeding member 4, and the light source substrate 33 are jointly fastened to the base wall 351 using the common joint fastening member 39. Therefore, it is possible to reduce the number of components and the number of types of components, compared to a case in which the elements are individually fixed to the base wall 351 using fixing members which are different from each other.

The reflecting sheet 36 further covers the connector 331 which is covered with the power feeding member 4. Accordingly, a portion of the reflecting sheet 36 in the vicinity of the connector 331 easily bends toward the front side, compared to a portion which is far from the connector 331. That is, since the connector 331 and the power feeding member 4 are connected in the anteroposterior direction, so-called floating of the reflecting sheet 36 easily occurs.

The floating of the reflecting sheet 36 can be suppressed due to joint fastening of the reflecting sheet 36, the power feeding member 4, and the light source substrate 33 to the base wall 351. The reason for this is that a separating distance between a position of the joint fastening and the position of the connector is less than the width of the light source substrate 33. In other words, since the vicinity of the portion of the reflecting sheet 36 which easily floats is pushed to the base wall 351 side due to the joint fastening member 39, the reflecting sheet does not easily float, compared to a case in which there is no pushing by the joint fastening member 39.

Since the power feeding member 4 is pushed to the base wall 351 side due to the joint fastening member 39, the light source connecting portion 44 is pushed to the connector 331. Accordingly, it is possible to suppress a situation in which the light source connecting portion 44 falls from the connector 331, and an electrical connection therebetween is uselessly released.

Each of the tongue pieces 42a on the base end side of the power feeding member 4 or the main body portion 41 may be jointly fastened to the base wall 351 along with the reflecting sheet 36. At this time, since the tongue piece 42a on the base end side or the main body portion 41 is closely fixed to the base wall 351, the entire power feeding member 4 is urged to the base wall 351 side. Then, since the light source connecting portion 44 is pushed to the connector 331, it is possible to suppress a situation in which a connection between the power feeding member 4 and the light source substrate 33 is uselessly released.

In a case in which the tongue piece 42a on the base end side is jointly fastened to the base wall 351 along with the reflecting sheet 36, when the position of joint fastening is the vicinity of the light source connecting portion 44, it is possible to suppress floating of the reflecting sheet 36.

In the above described case of the illumination device 22, power is fed from the power supply unit 37 to each of the light sources 34 through the wiring members 38 and 38, the power feeding members 4 and 4, and the light source substrates 33, 33, . . . .

It is possible to form a power feeding path using a pattern in respective power feeding members 4 and 4, and the light source substrates 33, 33, . . . (and wiring members 38 and 38 formed by using flexible printed board). Therefore, it is possible to easily perform wiring compared to a case in which power is fed to each of the light sources 34 from the power supply unit 37 through the wiring member 38, a plurality of feeder lines which are replaced to the power feeding members 4 and 4, and the light source substrates 33, 33, . . . .

Part of light emitted from the light sources 34, 34, . . . is directly input to the diffusion plate 31, and penetrates the diffusion plate 31. In addition, another part of light emitted from the light sources 34, 34, . . . is input to the diffusion plate 31 after being repeatedly reflected among the diffusion plate 31 and the reflecting sheet 36, or the joint fastening member 39, and penetrates the diffusion plate 31. The light penetrated the diffusion plate 31 penetrates the optical sheet group 30. As a result, the illumination device 22 illuminates the display panel 21 from the rear face side.

Light emitted from the light source 34 is not hindered by the reflecting sheet 36 or the joint fastening member 39. For this reason, a portion in the reflecting sheet 36 which covers the front face 33a of the light source substrate 33, and a height of the joint fastening members 39 from the respective front faces 33a are set to be lower than a height of the light source substrate 33 from the front face 33a, at a boundary portion between the light input portion 34a and the light output portion 34b of the lens 342.

Here, the reason why the light source substrate 33 at the highest position and the light source substrate 33 at the lowest position are reversed in the vertical direction and the horizontal direction will be described.

The arm piece 42 is downwardly pulled out from the light source substrate 33 at the highest position. Meanwhile, the arm piece 42 is upwardly pulled out from the light source substrate 33 at the lowest position. That is, the arm piece 42 is pulled out to a center portion side of the base wall 351 in the vertical direction from both of the two light source substrates 33 and 33. For this reason, it is possible to dispose the light source substrates 33 and 33 at the high side portion and the low side portion of the base wall 351.

When tentatively setting a direction of the light source substrate 33 at the lowest position to be the same as that of the light source substrate 33 at the highest position, since the arm piece 42 is pulled out to the low side portion from the light source substrate 33, it is not possible to dispose the light source substrate 33 at the low side portion of the base wall 351.

Meanwhile, since a direction in which the arm piece 42 is pulled out from each of the light source substrates 33 is the vertical direction, it is not necessary to pull out the arm piece 42 to the left side portion or the right side portion of the base wall 351. Therefore, it is possible to dispose the end portion of the light source substrate 33 to the left side portion or the right side portion of the base wall 351.

That is, it is possible to dispose the light source substrates 33, 33, . . . in the entire peripheral edge portions of the base wall 351. In other words, it is also possible to dispose the light sources 34, 34, . . . at the peripheral edge portion, not only at the center portion of the base wall 351. Accordingly, it is possible to improve luminance of the peripheral edge portion of the display region of the display panel 21. In addition, since a space on the base wall 351 does not become useless, it is possible to increase the number of light source substrates 33, 33, . . . which are disposed on the base wall 351. Since it is possible to dispose many light sources 34, 34, . . . that much, it is possible to improve luminance in the entire display region of the display panel 21.

Meanwhile, the light source substrate 33 at the highest position and the light source substrate 33 at the lowest position are set to be common. The reason for this is that, since each of the light source substrates 33 is laterally symmetry related to a disposal position of the connector 331, it is possible to make a distance from the power feeding member 4 to each connector 331 approximately the same, even when a direction of one light source substrate 33 in two light source substrates 33 and 33 is set to be reversed in the vertical direction and the horizontal direction.

When communizing the light source substrates 33, 33, . . . , it leads to a reduction in the number of components, and it is possible to obtain a reduction in cost due to a mass production, a simplification in managing of components, or the like.

In a case of assuming that the connector 331 is provided at one end portion of the light source substrate 33 in the lengthwise direction, when setting a direction of one light source substrate in two light source substrates 33 and 33 to be reversed in the vertical direction and horizontal direction, a distance from the power feeding member 4 to each of the connectors 331 becomes remarkably different in a case in which the connector 331 is located at a right end portion and in a case in which the connector 331 is located at a left end portion. Then, since it is necessary to individually change a protruding length of the power feeding member 4 from the main body portion 41 of each arm piece 42, a manufacturing procedure of the power feeding member 4 becomes complicated.

In order to solve this problem, a method of setting the light source substrate 33 in which the connector 331 is located at a right end portion of the low side portion to be disposed at the highest position, and setting the light source substrate 33 in which the connector 331 is located at a right end portion of the high side portion to be disposed at the lowest position is taken into consideration. However, in this case, it is not possible to communize the light source substrates 33, 33, . . . .

In a case in which the connector 331 is disposed at the center portion of the light source substrate 33 in the vertical direction and horizontal direction, symmetry of the light source substrate 33 related to a disposal position of the connector 331 improves. However, there is a possibility that the through-hole 332 cannot be provided at an appropriate position. In addition, in order to connect the connector 331 and the light source connecting portion 44, the power feeding member 4 uselessly covers the light source substrates 33 a lot.

The aligning state of the light source substrates 33, 33, . . . is not limited to the embodiment, and for example, the light source substrates 33, 33, . . . may be aligned by setting the lengthwise direction and the width direction to face the vertical direction and horizontal direction.

A disposal position of the respective power feeding members 4 and 4 in the horizontal direction is not particularly limited when it is a position other than the peripheral edge portion of the base wall 351. In addition, also a disposal position of the power supply connecting portion of the power feeding member 4 is not particularly limited. Disposal of these may be appropriately determined by taking into consideration of a separating distance from the power supply unit 37, a balance with disposal of the wiring member 38, interference with another member, or the like. That is, a degree of freedom in a disposal position of the power feeding member 4 and the power supply connecting portion is high.

A connecting direction of the connector 331 and the light source connecting portion 44 is not limited to a direction intersecting the front face 33a, and may be a direction which goes along the front face 33a.

However, it is preferable that the connecting direction of the connector 331 and the light source connecting portion 44 be the direction intersecting the front face 33a, rather than the direction which goes along the front face 33a. The reason for this is that, in the illumination device 22, there is a larger spatial allowance in the direction intersecting the front face 33a than that in the direction which goes along the front face 33a. As a result, it is possible to prevent the illumination device 22 from being uselessly large.

The power feeding member 4 may be configured of a flat cable. However, since it is not possible to provide a through-hole in the flat cable, it is necessary to attach the power feeding member 4 to the base wall 351 using a method other than joint fastening (for example, bonding using double sided tape, interposing using clip, or sealing using resin molding). However, even in this case, it is possible to jointly fasten the light source substrate 33 and the reflecting sheet 36 to the base wall 351.

In addition, the power feeding member 4 may not have optical transparency.

Embodiment 2

Figure 5:
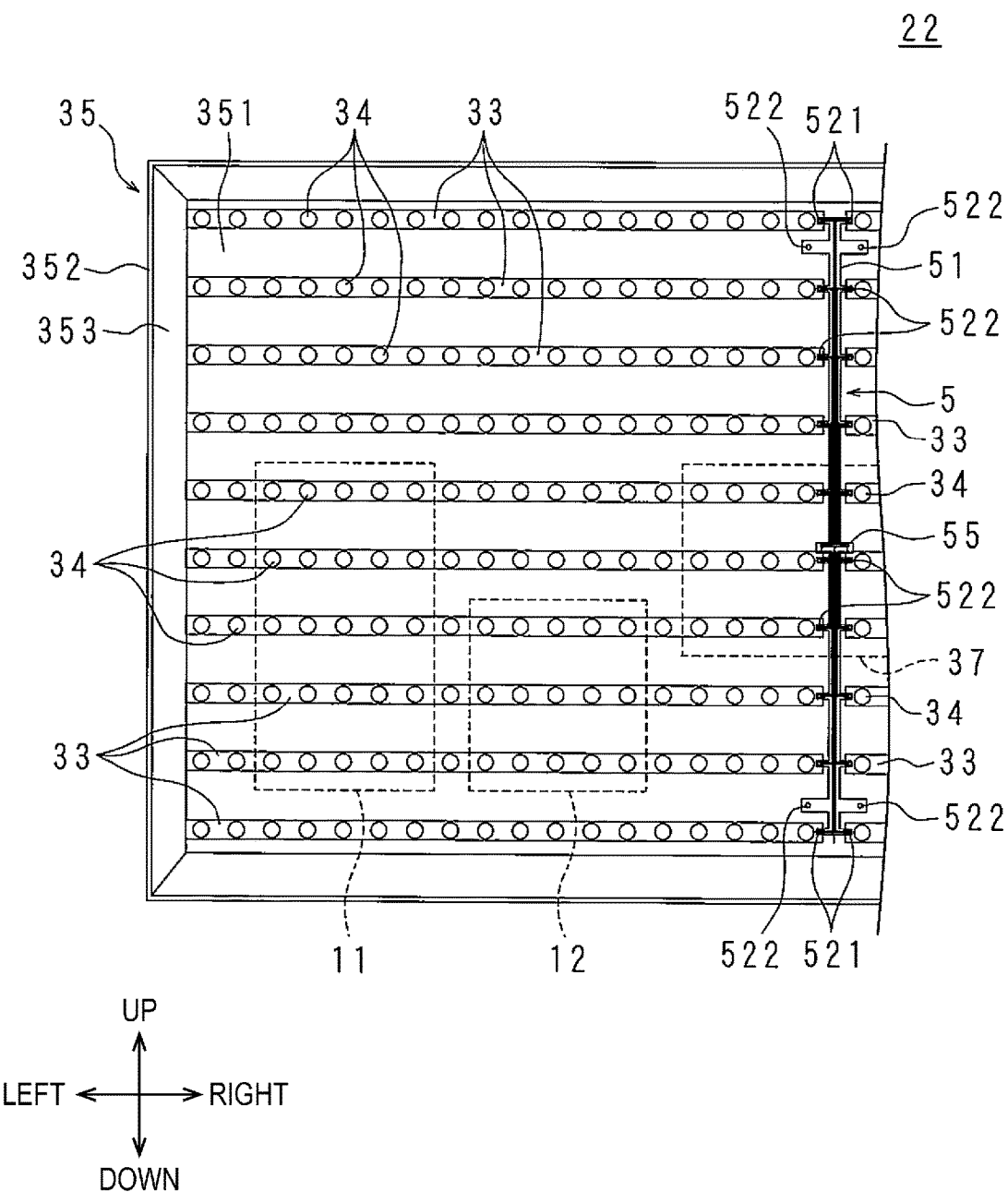
FIG. 5 is a front view which schematically illustrates a configuration of an illumination device provided in a display device according to Embodiment 2 of the disclosure.
Figure 6:
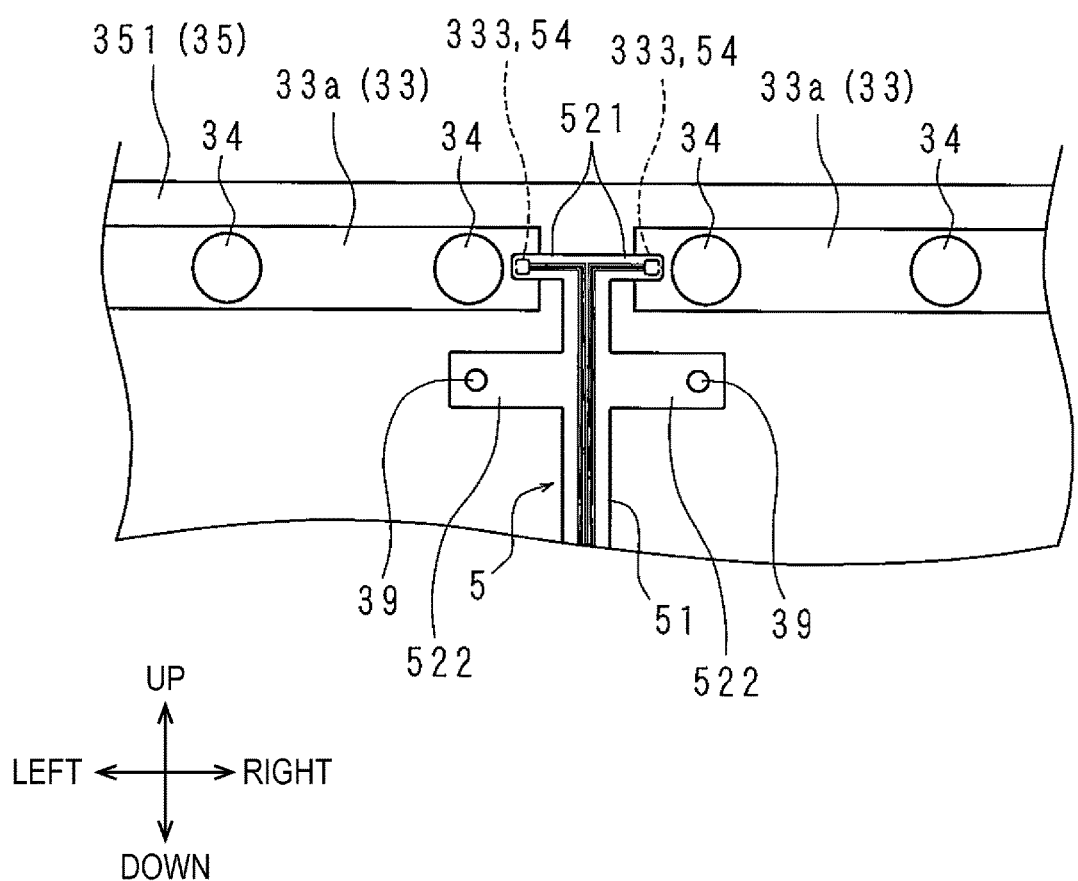
FIG. 6 is an enlarged front view which schematically illustrates a configuration of the illumination device.

FIGS. 5 and 6 are a front view which schematically illustrates a configuration of an illumination device 22 provided in a display device 13 according to Embodiment 2 Embodiment 2 of the disclosure, and an enlarged front view thereof. FIGS. 5 and 6 correspond to FIGS. 2 and 3 in Embodiment 1.

Figure 7:
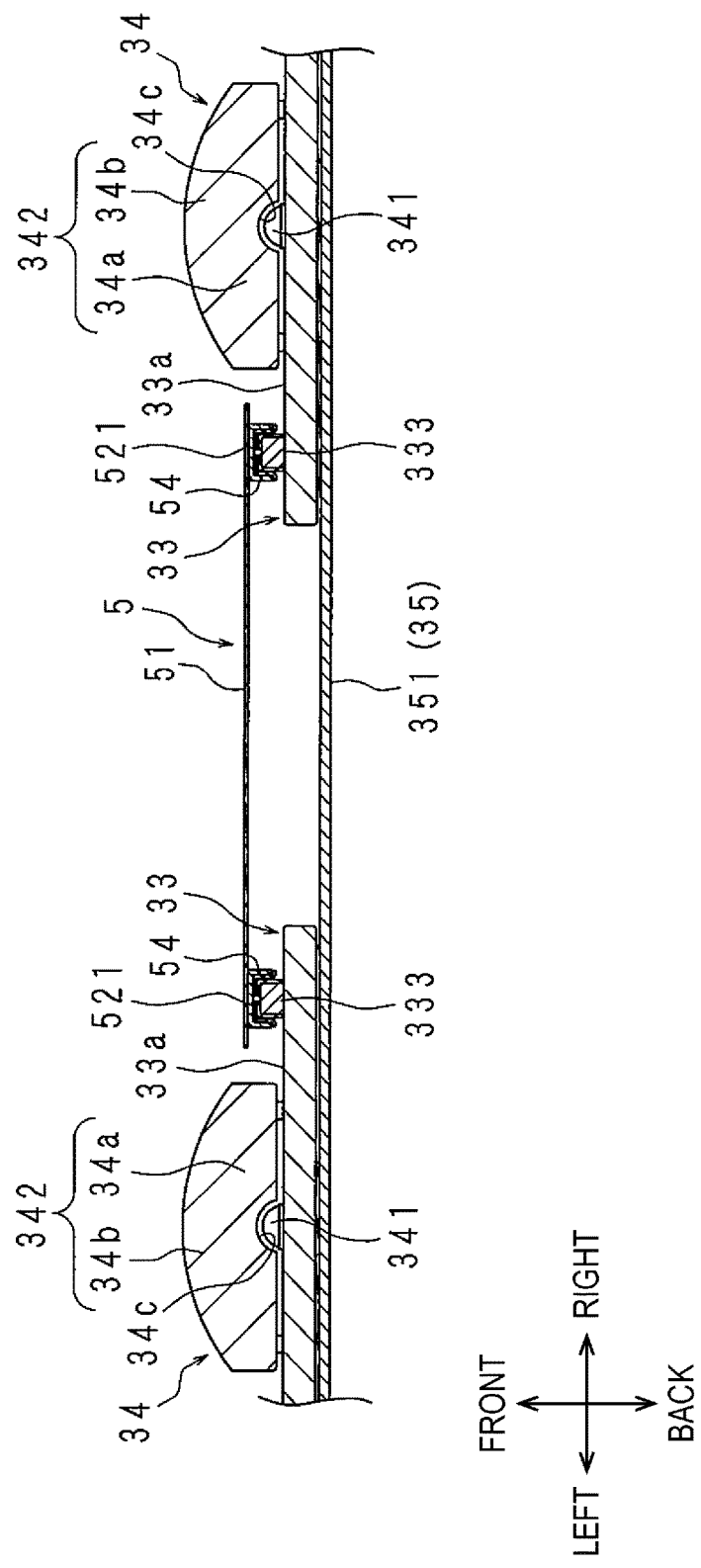
FIG. 7 is a sectional view which schematically illustrates a configuration of the illumination device in the vicinity of the light source substrate.
Figure 8:
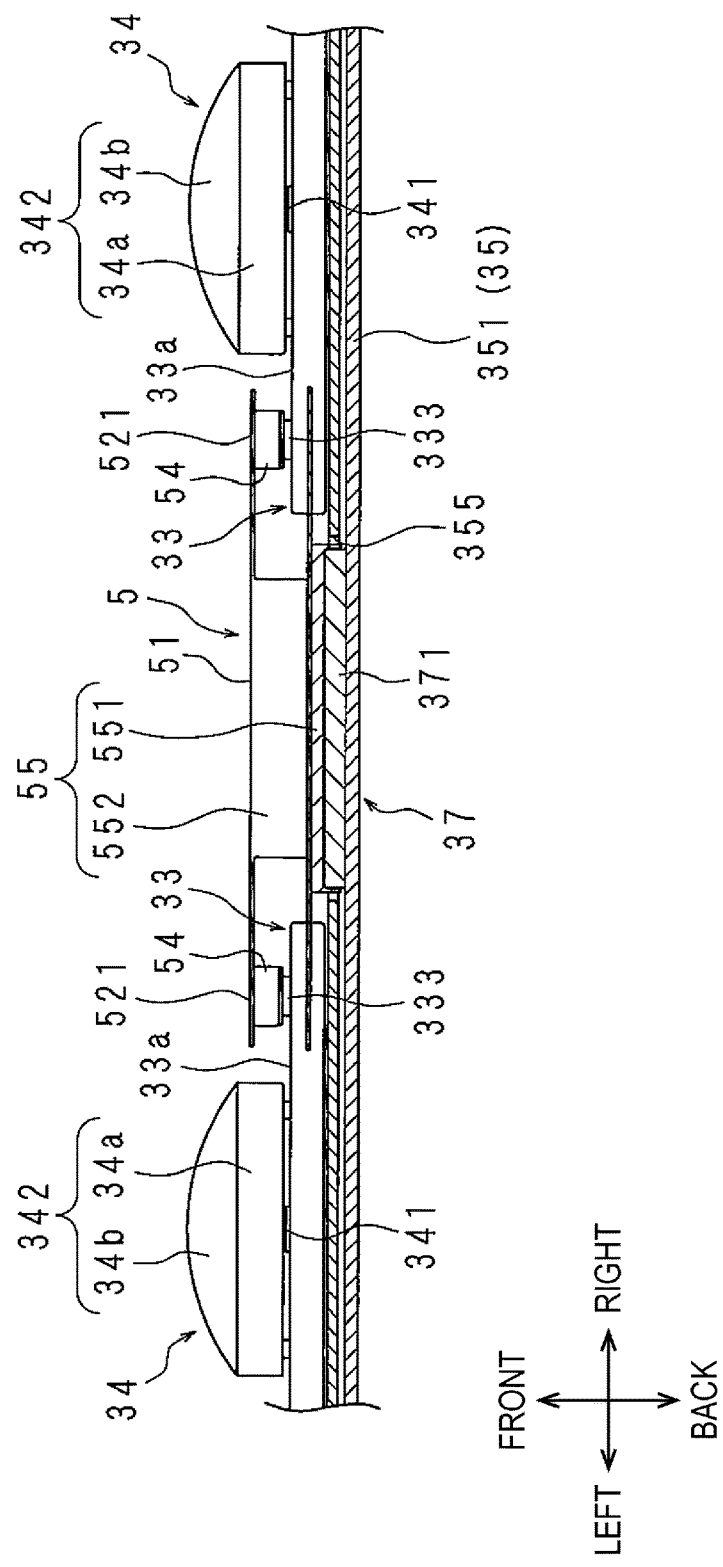
FIG. 8 is a sectional view which schematically illustrates a configuration of the illumination device in the vicinity of a power supply unit.

FIGS. 7 and 8 are sectional views which schematically illustrate configurations of the illumination device 22 in the vicinity of the light source substrate 33 and the vicinity of the power supply unit 37.

The display device 13 and the illumination device 22 in the embodiment have approximately the same configuration in the display device 13 and the illumination device 22 in the first embodiment. Hereinafter, differences from Embodiment 1 will be described, the same reference numerals will be attached to portions corresponding to Embodiment 1, and descriptions thereof will be omitted.

The connector 331 and the through-hole 332 according to Embodiment 1 are not provided in the light source substrate 33 in the embodiment.

A connector 333 is provided on the front face 33a of the light source substrate 33. The connector 333 has the same configuration as the connector 331 in Embodiment 1, except for a disposal position.

The connector 333 is disposed at a center portion at one short side portion (that is, end portion in lengthwise direction) in the light source substrate 33, in the width direction. The connectors 333 and 333 of two light source substrates 33 and 33 which are adjacent to each other in the horizontal direction are disposed at end portions in which the light source substrates 33 and 33 face each other. That is, in a case of each of the light source substrates 33 included in the first column on the left side, the connector 333 is disposed at the right side portion. In a case of each of the light source substrates 33 included in the first column on the right side, the connector 333 is disposed at the left side portion.

The through-holes 354, 354, . . . in Embodiment 1 are not provided on the base wall 351 of the accommodating body 35.

A through-hole 355 is provided on the base wall 351. A disposal position of the through-hole 355 is a center portion of the base wall 351 in the vertical direction and horizontal direction.

The through-holes 361, 361, . . . in Embodiment 1 are not provided in the reflecting sheet 36. The connector 333 of each of the light source substrates 33 is covered with the reflecting sheet 36. In FIGS. 7 and 8, the reflecting sheet 36 is not illustrated.

The power supply unit 37 includes a male connector 371. The connector 371 is inserted into the through-hole 355 of the base wall 351 from the rear face side, and protrudes into the accommodating body 35. However, a height of the connector 371 from the front face of the base wall 351 is lower than a height of the light source substrate 33 from the front face of the base wall 351.

The illumination device 22 according to the embodiment is not provided with the wiring members 38 and 38, and is provided with a power feeding member 5, instead of the power feeding members 4 and 4.

The power feeding member 5 is a member for feeding power from the power supply unit 37 to each of the light source substrates 33. According to Embodiment 1, two power feeding members 4 and 4 are disposed on the left and right sides, and power is fed to the respective light source substrates 33, 33, . . . in two columns on the left and right sides; however, in the embodiment, one power feeding member 5 is disposed at a center portion in the horizontal direction, and power is fed to the light source substrates 33, 33, . . . in two columns on the left and right sides.

The power feeding member 5 is formed of a flexible printed board of which a base film has optical transparency, and is disposed between the base wall 351 and the reflecting sheet 36. Since the power feeding member 5 is sufficiently thin, there is no concern that the base wall 351 and the reflecting sheet 36 are uselessly separated due to the power feeding member 5 which is interposed therebetween.

The power feeding member 5 contains a polyethylene terephthalate resin, or a polyethylene naphthalate resin. Therefore, the power feeding member 5 is cheaper than a general flexible printed board which contains a polyimide resin. In addition, when the polyethylene terephthalate resin, or the polyethylene naphthalate resin is used, it is possible to obtain a flexible printed board with optical transparency easily, and cheaply.

The power feeding member 5 includes a main body portion 51, a plurality of arm pieces 521, 521, . . . , and a plurality of tongue pieces 522, 522, . . . . The number of arm pieces 521, 521, . . . is the same as that of the light source substrates 33, 33, . . . . The number of tongue pieces 522, 522, . . . is four, for example.

A plurality of light source connecting portions 54, 54, . . . and the power supply connecting portion 55 are provided on one face of the power feeding member 5, and a power feeding path which individually connects the power supply connecting portion 55 and each of the light source connecting portions 54 is formed. Since the light source connecting portions 54, 54, . . . and the power supply connecting portion 55 are provided on the same face of the power feeding member 5, it is possible to reduce a manufacturing cost of the power feeding member 5 compared to a case in which these units are individually provided on different faces of the power feeding member 5. The number of light source connecting portions 54, 54, . . . is the same as the number of the arm pieces 521, 521, . . . .

The main body portion 51 is formed in a belt shape which is long in the vertical direction. A disposal position of the main body portion 51 is between the light source substrates 33, 33, . . . in the first column on the left side and the light source substrates 33, 33, . . . in the first column on the right side. That is, the main body portion 51 does not cover the light source substrate 33.

A higher end portion (or lower end portion) of the main body portion 51 is disposed between two light source substrates 33 and 33 which are adjacent to each other in the horizontal direction at the highest position (or lowest position).

The power supply connecting portion 55 is provided at a center portion of the main body portion 51 in the vertical direction. The power supply connecting portion 55 includes a female connector 551 corresponding to a connector 371 of the power supply unit 37, and a connection support unit 552 which supports the connector 551. The power supply connecting portion 55 is electrically connected to the connector 371 when the connector 551 is fitted into the connector 371 from the front side.

The connection support unit 552 is a unit for disposing the connector 551 by separating the connector from the main body portion 51 to the rear side, and for electrically connecting the connector 551 and a power feeding path formed in the main body portion 51. Since the connection support unit 552 is interposed between the connector 551 and the main body portion 51 in this manner, it is possible to suppress a situation in which the main body portion 51 is uselessly bent to the rear side due to the power supply connecting portion 55 which is connected to the connector 371.

In this manner, the power feeding member 5 is electrically connected to the power supply unit 37 through the power supply connecting portion 55 and the connector 371. As a result, each of the light source substrates 33 and the power supply unit 37 are electrically connected, individually, through the power feeding member 5.

Each of the arm pieces 521 of the power feeding member 5 is formed in a rectangular tongue shape in which the lengthwise direction is the horizontal direction. In the arm pieces 521, 521, . . . , two arm pieces protrude from the main body portion 51 toward a direction separating from the horizontal direction. That is, the arm pieces 521, 521, . . . are aligned in 10 rows and 2 columns. The arm piece 521 at the highest position (or lowest position) is provided in a protruding manner in the highest end portion (or lowest end portion) of the main body portion 51. A direction in which each of the arm pieces 521 protrudes from the main body portion 51, and a protruding length are the same.

Since the power feeding member 5 is flexible, disposal of each of the arm pieces 521 can be adjusted around a boundary portion with the main body portion 51, therefore, it is possible to align the arm piece 521 so as to be inclined to the main body portion 51.

The light source connecting portion 54 is provided at a tip end portion of the arm piece 521. The light source connecting portion 54 is a female connector corresponding to the connector 333. The light source connecting portion 54 is electrically connected to the connector 333 by being fitted into the connector 333 from the front side.

Since the light source connecting portion 54 is provided in the arm piece 521, it is easy to adjust a disposal position of the light source connecting portion 54 compared to a case in which the light source connecting portion 54 is provided in the main body portion 51. Therefore, it is possible to easily connect the light source connecting portion 54 and the connector 333 even when the main body portion 51 and the light source substrates 33, 33, . . . are relatively shifted due to a dimensional error, a trouble at a time of disposal, or the like, or when a positional shift, or the like, due to an expansion or a contraction caused by a temperature change occurs, and it is possible to suppress a situation in which a connection is uselessly released.

A work of connecting the light source connecting portion 54 to the connector 333 by a manufacturer is a work which needs high workability. The reason for this is that, since the power feeding member 5 has optical transparency, it is possible to easily confirm a disposal position of the connector 333 through the power feeding member 5, even when the connector 333 is covered with the power feeding member 5.

Each of the arm pieces 521 covers a portion in which the connector 333 of the light source substrate 33 is provided. Since the connector 333 is provided at a short side portion of the light source substrate 33, the power feeding member 5 does not uselessly cover the light source substrate 33.

Each of the tongue pieces 522 of the power feeding member 5 is formed in a rectangular tongue shape in which the lengthwise direction is the horizontal direction. Two tongue pieces of the tongue piece 522, 522, . . . protrude from the main body portion 51 toward a direction separating from the horizontal direction. The tongue piece 522 on the higher side (or lower side) is disposed between the light source substrate 33 at the highest position (or lowest position) and a light source substrate 33 which is adjacent to the lower side (or higher side) of the light source substrate. That is, each of the tongue pieces 522 does not cover the light source substrate 33.

A through-hole (not illustrated) is provided at a tip end portion of the tongue piece 522. A through-hole (not illustrated) corresponding to the through-hole is provided on the reflecting sheet 36. The tongue pieces 522, 522, . . . and the reflecting sheet 36 are jointly fastened to the base wall 351 using the joint fastening members 39, 39, . . . . Therefore, it is possible to reduce the number of components and the number of types of components, compared to a case in which these elements are individually fixed to the base wall 351 using fixing members which are different from each other.

Each of the tongue pieces 522 is closely fixed to the base wall 351 by being jointly fastened to the reflecting sheet 36. As a result, since the power feeding member 5 is urged to the base wall 351 side, and the light source connecting portion 54 is pushed to the connector 333, it is also possible to suppress a situation in which the light source connecting portion 54 falls from the connector 333, and an electrical connection between them is uselessly released.

The tongue pieces 522, 522, . . . may be closely fixed to the base wall 351, regardless of the reflecting sheet 36, or using a fixing member except for the joint fastening member 39, 39, . . . .

In a case of the above described illumination device 22, power is fed from the power supply unit 37 to each of the light sources 34 through the power feeding member 5 and the light source substrates 33, 33, . . . .

As a result, the illumination device 22 can exhibit the same operational effect as that of the illumination device 22 according to Embodiment 1. Moreover, since the illumination device 22 according to the embodiment is provided with one power feeding member 5, and is directly connected to the power supply unit 37, in contrast to the illumination device 22 according to Embodiment 1 which is provided with two power feeding members 4 and 4, and is connected to the power supply unit 37 through the wiring members 38 and 38, it is possible to reduce the number of components.

Meanwhile, since a direction in which the arm piece 521 is pulled out from each of the light source substrates 33 in the horizontal direction, it is not necessary to pull out the arm piece 521 to the high side portion or the low side portion of the base wall 351. In addition, the connector 333 of each of the light source substrates 33 is provided at an end portion of the base wall 351 on the center portion side in the horizontal direction, in the light source substrate 33. Accordingly, it is not necessary to pull out the arm piece 521 to the left side portion or the right side portion of the base wall 351.

As described above, the power feeding member 5 is not disposed on the high side portion side (or low side portion side) of the base wall 351 compared to the light source substrates 33 and 33 at the highest position (or lowest position). In addition, the power feeding member 5 is not disposed on the left side portion side (or right side portion side) of the base wall 351 compared to the light source substrates 33, 33, . . . in the first column on the left side (or right side).

As a result, since it is possible to dispose the light source substrates 33, 33, . . . at the peripheral edge portion of the base wall 351, it is possible to dispose the light sources 34, 34, . . . at the peripheral edge portion of the base wall 351. Accordingly, it is possible to improve luminance at the peripheral edge portion of the display region of the display panel 21. In addition, since a space on the base wall 351 does not become useless, it is possible to increase the number of light source substrates 33, 33, . . . disposed on the base wall 351. Since it is possible to dispose a lot of light sources 34, 34, . . . that much, luminance in the entire display region of the display panel 21 can be improved.

Embodiment 3

Figure 9:
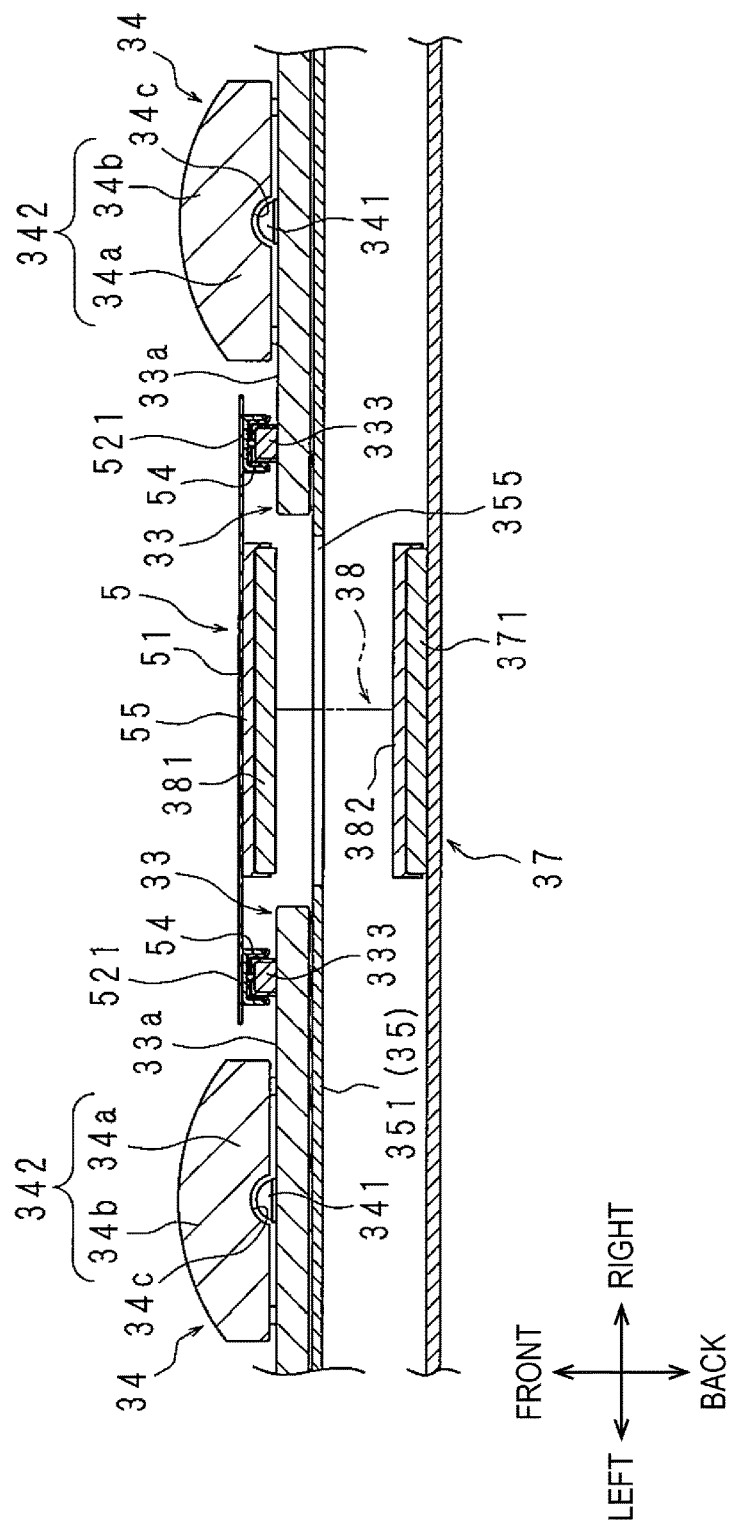
FIG. 9 is a sectional view which schematically illustrates a configuration of an illumination device in the vicinity of a power supply unit provided in a display device according to Embodiment 3 of the disclosure.

FIG. 9 is a sectional view which schematically illustrates a configuration of an illumination device 22 provided in a display device 13 according to Embodiment 3 of the disclosure, in the vicinity of a power supply unit 37. FIG. 9 corresponds to FIGS. 7 and 8 in Embodiment 2.

The display device 13 and the illumination device 22 according to the embodiment have approximately the same configuration as the display device 13 and the illumination device 22 in Embodiment 2. Hereinafter, differences from Embodiment 2 will be described, the same reference numerals are attached to portions corresponding to Embodiment 2, and descriptions thereof will be omitted.

In a power supply connecting portion 55 of the power feeding member 5, an element corresponding to the connector 551 in Embodiment 2 is directly provided in the main body portion 51, and the connection support unit 552 in Embodiment 2 is not provided. For this reason, the power feeding member 5 in the embodiment has a simple configuration compared to that in Embodiment 2.

The connector 371 of the power supply unit 37 is not inserted into the through-hole 355 of the base wall 351, and is located outside the accommodating body 35.

The illumination device 22 according to the embodiment is provided with the wiring member 38. The wiring member 38 is pulled out to the inside and outside of the accommodating body 35 through the through-hole 355 of the base wall 351, and electrically connects the power supply connecting portion 55 of the power feeding member 5 and the connector 371 of the power supply unit 37. For this reason, the wiring member 38 includes a male connector 381 corresponding to the power supply connecting portion 55, and a female connector 382 corresponding to the connector 371.

As a result, each of the light source substrates 33 and the power supply unit 37 are electrically connected, individually, through the power feeding member 5.

The above described illumination device 22 exhibits the same operational effect as that of the illumination device 22 in Embodiment 2.

In addition, since the wiring member 38 is interposed between the connector 371 and the power supply connecting portion 55, it is possible to suppress a situation in which the main body portion 51 uselessly bends to the rear side due to the power supply connecting portion 55 which is connected to the connector 371.

Subsequently, Embodiments 1 to 3 of the disclosure will be summarized.

In the illumination device 22 in the disclosure which is provided with the dish-shaped accommodating body 35, the plurality of light source substrates 33 on which the light source 34 is mounted on each one face, and which are aligned on an inner face of the base wall 351 of the accommodating body 35, the reflecting sheet 36 which covers the one face, and the inner face of the accommodating body 35, and reflects light, and the power supply unit 37, the illumination device 22 includes the connectors 331 and 333 which are provided on the one face; the power feeding members 4 and 5 which are formed of a flexible printed board, disposed between the base wall 351 and the reflecting sheet 36, and feeds power from the power supply unit 37 to the light source substrate 33; and the light source connecting portions 44 and 54 which are provided in the power feeding members 4 and 5, and are electrically connected to the connectors 331 and 333.

In the illumination device 22 in the disclosure, the power feeding members 4 and 5 are formed in a belt shape, are electrically connected to the power supply unit 37, the light source substrates 33 are formed in a strip shape, and are aligned in the width direction of the light source substrate 33 along the lengthwise direction of the power feeding members 4 and 5.

In the illumination device 22 according to the disclosure, the power feeding member 5 is formed in a belt shape, is electrically connected to the power supply unit 37, end portions of two of the light source substrates 33 are adjacent to each other in the width direction of the power feeding member 5, and the connector 333 is disposed at the end portion.

In the illumination device 22 in the disclosure, the light source 34 includes the light emitting unit 341 mounted on the one face, and the lens 342 which covers the light emitting unit 341, and includes the light input portion 34*a* to which light emitted from the light emitting unit 341 is input, and a light output portion 34*b* from which light input to the light input portion 34*a* is output, and the height of the reflecting sheet 36 from the one face at a portion which covers the one face is lower than the height of the light output portion 34*b* from the one face.

In the illumination device 22 according to the disclosure, the through-hole 355 is provided on the base wall 351, the power supply unit 37 is disposed on the outer face of the base wall 351, and is electrically connected to the power feeding member 5 through the through-hole 355.

In the illumination device 22 according to the disclosure, the light source connecting portion 54, and the power supply connecting portion 55 for being electrically connected to the power supply unit 37 are provided on one face of the power feeding member 5.

In the illumination device 22 according to the disclosure, the portion in which the light source connecting portion 54 of the power feeding member 5 is provided is covered with the connector 333, the power feeding member 5 includes the tongue piece 522, and the tongue piece 522 is closely fixed to the base wall 351.

In the illumination device 22 according to the disclosure, the power feeding members 4 and 5 include the belt-shaped main body portions 41 and 51, and the plurality of arm pieces 42 and 521 which are provided in a protruding manner in the main body portions 41 and 51, and the light source connecting portions 44 and 54 are provided in the arm pieces 42 and 521.

In the illumination device 22 according to the disclosure, each of the light source substrates 33 and the power supply unit 37 are electrically connected, individually, through the power feeding members 4 and 5.

The display device 13 according to the disclosure is provided with the illumination device 22 according to the disclosure, and the display panel 21 which is illuminated from the rear face side using the illumination device 22.

A television receiver includes the display device 13 according to the disclosure, and the reception unit 11 which receives television broadcasting, and displays pictures on the display device 13 based on the television broadcasting received in the reception unit.

In the disclosure, the power feeding member is formed of a flexible printed board. Therefore, wiring becomes easy, compared to a case in which a plurality of feeder lines are electrically connected to each of the light source substrates.

In the disclosure, the strip-shaped light source substrates are aligned in the width direction along the lengthwise direction of the belt-shaped power feeding member. Accordingly, it is possible to easily increase the number of light source substrates to which power is fed through the power feeding member, compared to a case in which the strip-shaped light source substrates are aligned in the lengthwise direction along the lengthwise direction of the belt-shaped power feeding member.

In the disclosure, since the connectors are provided in respective facing end portions of two light source substrates which are adjacent to each other, it is possible to easily connect light source substrates of two times to the power feeding member, compared to a case in which the connector is provided at portions other than the facing end portions of the two light source substrates which are adjacent to each other. Accordingly, when the number of light source substrates is the same, it is possible to reduce the number of power feeding members.

In the disclosure, the reflecting sheet is disposed on the light source substrate side rather than the light output portion of the light source. Therefore, it is possible to suppress a situation in which the reflecting sheet, the power feeding member which is covered with the reflecting sheet, the connector, or the like, hinders light emission from the light source.

In the disclosure, it is possible to electrically connect the power supply unit and the light source substrate using a simple configuration through the through-hole provided on the base wall of the accommodating body.

In the disclosure, the light source connecting portion and the power supply connecting portion are provided on the same face of the power feeding member. Therefore, it is possible to reduce a manufacturing cost of the power feeding member compared to a case in which these are provided on different faces.

In the disclosure, since the tongue piece is closely fixed to the base wall of the accommodating body, the entire power feeding member is urged to the base wall side. Then, since the light source connecting portion is pushed to the connector, it is possible to suppress a situation in which a connection between the power feeding member and the connector is uselessly released.

In the disclosure, a degree of freedom in disposal of the individual arm piece is high compared to the main body portion. Therefore, even when there is a positional shift between the main body portion and the light source substrate, for example, it is possible to easily absorb the positional shift depending on disposal of the arm piece. Accordingly, it is easy to connect the light source connecting portion which is provided in the arm piece and the connector, compared to a case in which the light source connecting portion is provided in the main body portion, and moreover, it is possible to suppress useless releasing of the connection.

In the disclosure, since each of the light source substrate and the power supply unit are electrically connected, individually, through the power feeding member, it is possible to correspond to local dimming, while making wiring easy.

Embodiment 4

Figure 10:
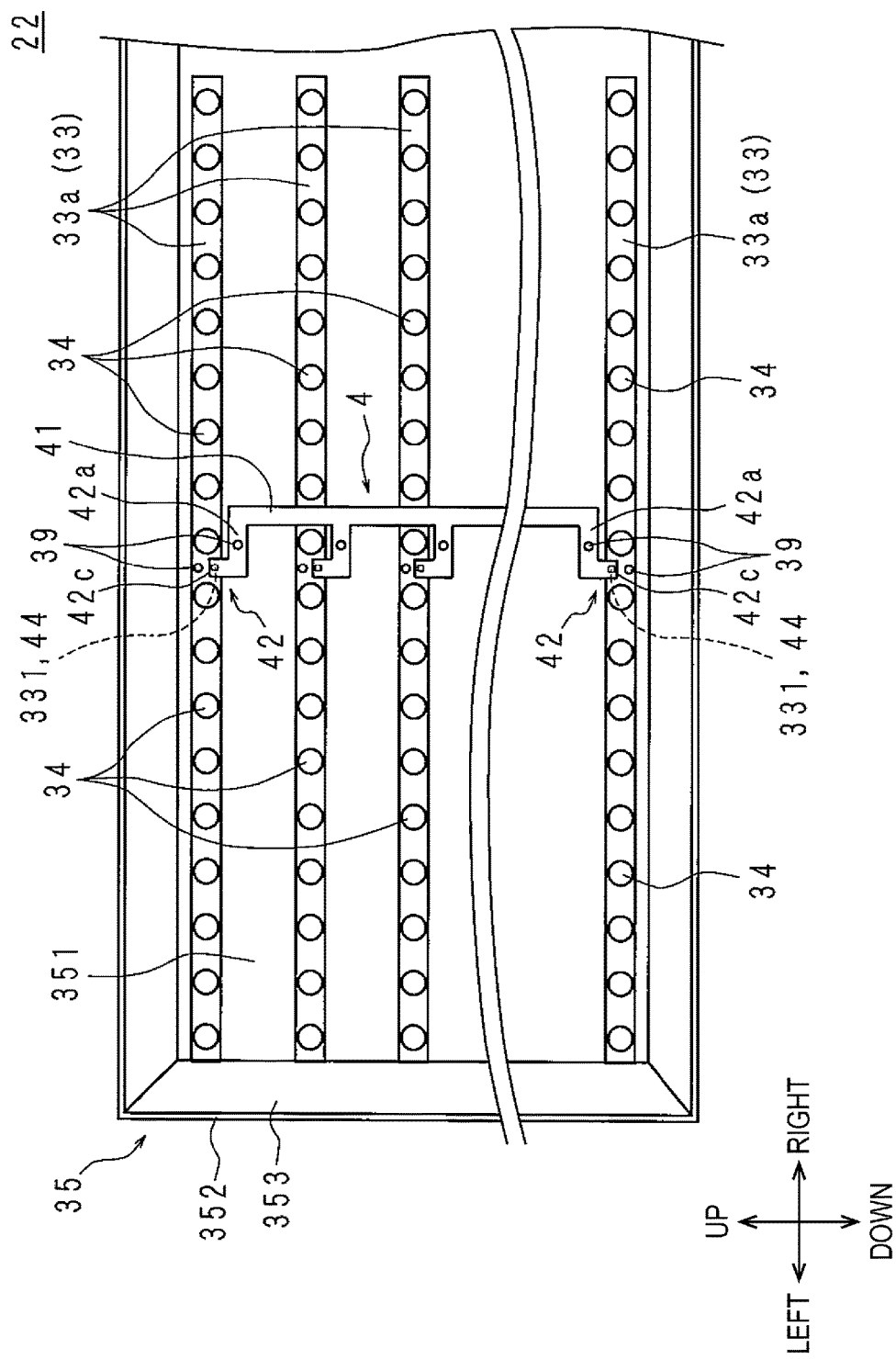
FIG. 10 is an enlarged front view which schematically illustrates a configuration of an illumination device provided in a display device according to Embodiment 4 of the disclosure.

FIG. 10 is an enlarged front view which schematically illustrates a configuration of an illumination device 22 provided in a display device 13 according to Embodiment 4 of the disclosure.

FIG. 11 is a sectional view which schematically illustrates a configuration in the vicinity of the light source substrate 33 of the illumination device 22.

FIGS. 10 and 11 correspond to FIGS. 3 and 4 in Embodiment 1. The display device 13 and the illumination device 22 in the embodiment have the same configuration as the display device 13 and the illumination device 22 in Embodiment 1. Hereinafter, differences from Embodiment 1 will be described, the same reference numerals are attached to portions corresponding to Embodiment 1, and descriptions thereof will be omitted.

Each of arm pieces 42 provided in the power feeding member 4 includes a base end side tongue piece 42a, and a tip end side tongue piece 42c corresponding to the tip end side tongue piece 42b in Embodiment 1.

A length of the tip end side tongue piece 42c is approximately a half of the tip end side tongue piece 42b in Embodiment 1. A through-hole which is the same as the through-hole 43 in Embodiment 1 is not provided in the tip end side tongue piece 42c. The light source connecting portion 44 is provided at the tip end portion of the tip end side tongue piece 42c. In the embodiment, the light source connecting portion 44 is also electrically connected to the connector 331.

The tip end side tongue piece 42c covers a portion between two light sources 34 and 34 on the front face 33a of the light source substrate 33 in which the connector 331 is provided; however, the tip end side tongue piece does not cover a portion in which the through-hole 332 is provided. Since the connector 331 is provided at a long side portion (that is, end portion of light source substrate 33 in width direction) of the light source substrate 33, the power feeding member 4 does not cover the light source substrate 33, uselessly.

The light source substrate 33 and the reflecting sheet 36 are jointly fastened to the base wall 351 using the joint fastening member 39. However, the power feeding member 4 is not jointly fastened to the base wall 351 along with the light source substrate 33.

Each of the base end side tongue pieces 42a of the power feeding member 4 and the reflecting sheet 36 are jointly fastened to the base wall 351 using the joint fastening member 39. At this time, since the base end side tongue pieces 42a is closely fixed to the base wall 351, the power feeding member 4 is entirely urged to the base wall 351 side. Then, since the light source connecting portion 44 is pushed to the connector 331, it is possible to suppress a situation in which a connection between the power feeding member 4 and the light source substrate 33 is uselessly released.

In a case in which the base end side tongue pieces 42a is jointly fastened to the base wall 351 along with the reflecting sheet 36, when a position of the joint fastening is the vicinity of the light source connecting portion 44, it is possible to suppress floating of the reflecting sheet 36.

As described above, the illumination device 22 exhibits the same operational effect as the illumination device 22 in Embodiment 1.

Embodiment 5

Figure 12:
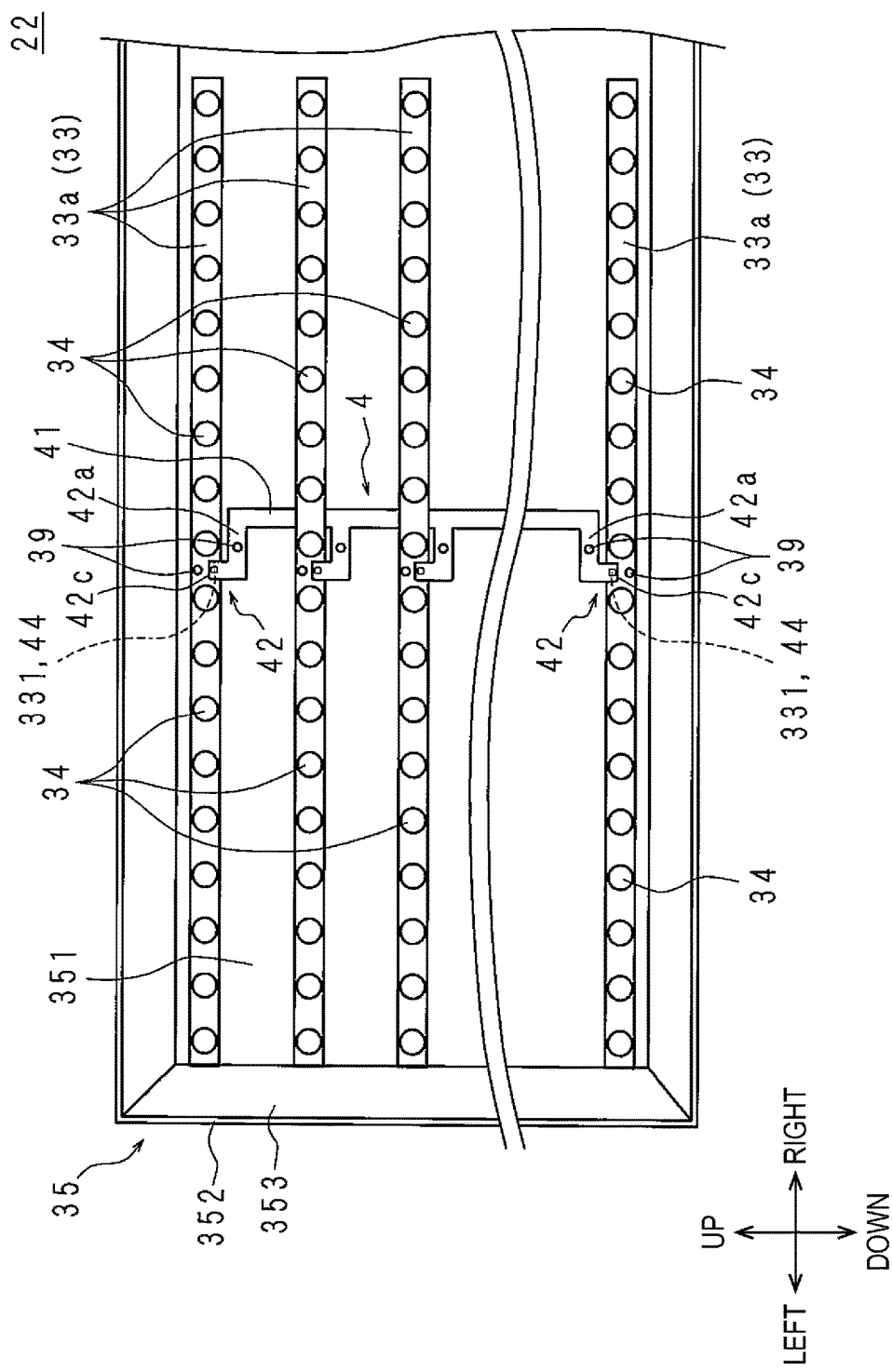
FIG. 12 is an enlarged front view which schematically illustrates a configuration of an illumination device provided in a display device according to Embodiment 5 of the disclosure.

FIG. 12 is an enlarged front view which schematically illustrates a configuration of an illumination device 22 provided in a display device 13 according to Embodiment 5 of the disclosure.

FIG. 12 corresponds to FIG. 10 in Embodiment 4.

The display device 13 and the illumination device 22 in the embodiment have approximately the same configuration as the display device 13 and the illumination device 22 in Embodiment 4. Hereinafter, differences from Embodiment 4 are described, the same reference numerals will be attached to portions corresponding to Embodiment 4, and descriptions thereof will be omitted.

The main body portion 41 included in the power feeding member 4 is disposed between the light source substrates 33, 33, . . . and the base wall 351. Accordingly, the power feeding member 4 does not cover the light source substrate 33 uselessly.

Since the power feeding member 4 is sufficiently thin, there is no concern that the base wall 351 and each of the light source substrates 33 are uselessly separated, due to the power feeding member 4 interposed therebetween.

As described above, the illumination device 22 exhibits the same operational effect as the illumination device 22 in Embodiment 4.

The display device according to Embodiments 1 to 6 of the disclosure is not limited to the display device 13 which is configured as the television receiver 1, and may be configured as an electronic signboard, a monitor for a personal computer, or the like.

The illumination device according to Embodiments 1 to 6 of the disclosure is not limited to a configuration of being incorporated in the display device 13. For example, the illumination device may be configured as a backlight unit of a display unit provided in a mobile phone, a portable information terminal apparatus, or the like. Alternatively, the illumination device may be configured as a ceiling light, wall-hanging lighting equipment, or the like.

Finally, the first, fourth, and fifth embodiments of the disclosure will be summarized.

In the illumination device 22 in the disclosure which is provided with the dish-shaped accommodating body 35, the plurality of light source substrates 33 on which the light source 34 is mounted on each one face, and which are aligned on an inner face of the base wall 351 of the accommodating body 35, the reflecting sheet 36 which covers the one face, and the inner face of the accommodating body 35, and reflects light, and the power supply unit 37, the light source substrate 33 is formed in a strip shape, and the illumination device 22 includes the connector 331 which is provided on the one face of the light source substrate 33 at a non-end portion in the lengthwise direction; the power feeding member 4 which is formed of a flexible printed board or a flat cable, disposed between the base wall 351 and the reflecting sheet 36, and feeds power from the power supply unit 37 to the light source substrate 33; and the light source connecting portion 44 which is provided in the power feeding member 4, and is electrically connected to the connector 331.

In the illumination device 22 according to the disclosure, the connector 331 is disposed in two central regions among four regions obtained by virtually and equally dividing the light source substrate 33 in a lengthwise direction.

In the illumination device 22 according to the disclosure, the connector 331 is disposed at an end portion of the light source substrate 33 in the width direction.

In the illumination device 22 according to the disclosure, at least one of the light source substrates 33 is disposed at the peripheral edge portion of the base wall 351, the power feeding member 4 is disposed at a center portion side of the base wall 351, compared to the light source substrate 33 which is disposed at the peripheral edge portion of the base wall 351.

In the illumination device 22 according to the disclosure, the light source substrate 33 or the power feeding member 4 is jointly fastened to the base wall 351 along with the reflecting sheet 36.

The display device 13 in the disclosure is provided with the illumination device 22 according to the disclosure, and the display panel 21 which is illuminated from the rear face side using the illumination device 22.

The television receiver is provided with the display device 13 according to the disclosure, and the reception unit 11 which receives television broadcasting, and displays pictures on the display device 13 based on the television broadcasting received in the reception unit 11.

In the disclosure, the connector is provided at the non-end portion of the light source substrate in the lengthwise direction. That is, the light source substrate is approximately symmetric with respect to the disposal position of the connector in the lengthwise direction. The light source substrates which are symmetric in the lengthwise direction have approximately the same distance from the power supply unit to the connector, even when rotating by 180° in a plane direction of the light source substrate.

In the disclosure, the connector is provided at the center portion of the light source substrate in the lengthwise direction. That is, the light source substrate is highly symmetric with respect to the disposal position of the connector in the lengthwise direction.

In the disclosure, the connector is provided at the end portion of the light source substrate in the width direction. Therefore, the power feeding member which is connected to the connector does not uselessly cover the light source substrate, compared to a case in which the connector is provided at the center portion of the light source substrate in the width direction.

In the disclosure, since the power feeding member is not disposed at the peripheral edge portion side of the base wall compared to the light source substrate which is disposed at the peripheral edge portion side of the base wall of the accommodating body, it is possible to dispose the light source substrate so as to be close to a boundary portion with a side wall of the accommodating body on the base wall of the accommodating body.

In the disclosure, since the reflecting sheet is jointly fastened to the base wall of the accommodating body along with the light source substrate or the power feeding member, it is possible to reduce the number of fixing members, compared to a case in which the reflecting sheet and the light source substrate, or the reflecting sheet and the power feeding member are individually fixed to the base wall of the accommodating body.

According to the illumination device in the disclosure and the display device, since the light source substrates are approximately symmetric in the lengthwise direction, it is possible to make the light source substrate common. Therefore, it is possible to reduce the number of components. Accordingly, it is possible to reduce a cost due to the reduction in the number of components.

The embodiments which are disclosed this time are examples in every aspect, and are not limited. The scope of the disclosure is not limited to the above descriptions, and in which the equivalents of the scope of the disclosure, and all of modifications in the scope of claims are included.

As long as there is an effect of the disclosure, constituent elements which are not disclosed in Embodiments 1 to 3 may be also included in the television receiver 1, the display device 13, or the illumination device 22.

It is possible to combine constituent elements (technical characteristics) disclosed in each embodiment each other, and it is possible to form new technical characteristics by combining thereof.

It is to be noted that the disclosed embodiment is illustrative and not restrictive in all aspects. The scope of the present invention is defined by the appended claims rather than by the description preceding them, and all changes that fall within metes and bounds of the claims, or equivalence of such metes and bounds thereof are therefore intended to be embraced by the claims.

The invention claimed is:

1. An illumination device which is provided with a dish-shaped accommodating body, light source substrates on each of which a light source is mounted on a first face, and which are aligned on an inner face of a base wall of the accommodating body, a reflecting sheet which covers the first faces, and an inner face of the accommodating body, and reflects light, and a power supply, the illumination device comprising:
   connectors, one of which is provided on one of the first faces;
   a power feeder including a flexible printed board, disposed between the base wall and the reflecting sheet, and feeds power from the power supply to the light source substrates; and
   light source connectors which are provided in the power feeder, and one of which is electrically connected to one of the connectors, wherein
   a through-hole is provided on the base wall,
   the power feeder is provided with a power supply connector, and
   the power supply is on an outer face of the base wall, and includes a connector which is directly connected to the power supply connector through the through-hole.

2. The illumination device according to claim 1, wherein the power feeder is defined in a belt shape, and the light source substrates are defined in a strip shape, and are aligned in a width direction of the light source substrates along a lengthwise direction of the power feeder.

3. The illumination device according to claim 1, wherein the power feeder is defined in a belt shape,
end portions of two of the light source substrates are adjacent to each other in a width direction of the power feeder, and
one of the connectors is disposed at one of the end portions.

4. The illumination device according to claim 1, wherein each of the light sources include:
a light emitter which is mounted on one of the first faces, and
a lens which covers the light emitter, and includes a light input portion to which light emitted from the light emitter is input, and a light output portion from which light input to the light input portion is output, and
a height of the reflecting sheet from the first faces at a portion which covers the first faces is lower than a height of the light output portion from the first faces.

5. The illumination device according to claim 1, wherein the light source connectors and the power supply connector are provided on one face of the power feeder.

6. The illumination device according to claim 1, wherein
a portion of the power feeder in which one of the light source connectors is provided covers one of the connectors, and
the power feeder includes a tongue fixed to the base wall.

7. The illumination device according to claim 1, wherein the power feeder includes a belt-shaped main body, and arms which are provided in a protruding manner in the main body, and one of the light source connectors is provided in one of the arms.

8. The illumination device according to claim 1, wherein each of the light source substrates and the power supply are electrically connected, individually, through the power feeder.

9. An illumination device which is provided with a dish-shaped accommodating body, light source substrates on each of which a light source is mounted on a first face, and which are aligned on an inner face of a base wall of the accommodating body, a reflecting sheet which covers the first faces, and an inner face of the accommodating body, and reflects light, and a power supply, in which the light source substrates are defined in a strip shape and the light source substrates are aligned in a width direction and a lengthwise direction of the light source substrates, the illumination device comprising:
connectors, one of which is provided on one of the first faces of the light source substrates on a non-end portion in the lengthwise direction of the light source substrates;
a power feeder including a flexible printed board, or a flat cable, disposed between the base wall and the reflecting sheet, and feeds power from the power supply to the light source substrates; and
light source connectors which are provided in the power feeder, and one of which is electrically connected to one of the connectors.

10. The illumination device according to claim 9, wherein the connectors are disposed one each in two central regions among four regions obtained by virtually and equally dividing the light source substrates in the lengthwise direction.

11. The illumination device according to claim 9, wherein the connectors are disposed one each at an end portion of the light source substrates in the width direction.

12. The illumination device according to claim 9, wherein
at least one of the light source substrates is disposed at a peripheral edge portion of the base wall, and
the power feeder is disposed on a center portion side of the base wall compared to the at least one of the light source substrates which is disposed at the peripheral edge portion of the base wall.

13. The illumination device according to claim 9, wherein the light source substrates or the power feeder is jointly fastened to the base wall together with the reflecting sheet.

14. A display device comprising:
the illumination device according to claim 1; and
a display panel which is illuminated from a rear face side using the illumination device.

15. A display device comprising:
the illumination device according to claim 9; and
a display panel which is illuminated from a rear face side using the illumination device.

* * * * *